(12) United States Patent
Tsurusaki et al.

(10) Patent No.: US 9,712,162 B2
(45) Date of Patent: Jul. 18, 2017

(54) INPUT DEVICE, DISPLAY DEVICE, ELECTRONIC DEVICE, AND MOBILE TERMINAL

(71) Applicant: KYOCERA Corporation, Kyoto-shi, Kyoto (JP)

(72) Inventors: Kouji Tsurusaki, Kirishima (JP); Katsuya Chaen, Kirishima (JP); Hiroshi Tokumori, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 204 days.

(21) Appl. No.: 14/379,716

(22) PCT Filed: Feb. 19, 2013

(86) PCT No.: PCT/JP2013/053982
§ 371 (c)(1),
(2) Date: Aug. 19, 2014

(87) PCT Pub. No.: WO2013/125519
PCT Pub. Date: Aug. 29, 2013

(65) Prior Publication Data
US 2015/0021157 A1   Jan. 22, 2015

(30) Foreign Application Priority Data
Feb. 23, 2012   (JP) ................................. 2012-037583

(51) Int. Cl.
*H03K 17/975* (2006.01)
*H03K 17/96* (2006.01)
(Continued)

(52) U.S. Cl.
CPC ......... *H03K 17/962* (2013.01); *G06F 1/1643* (2013.01); *G06F 3/041* (2013.01);
(Continued)

(58) Field of Classification Search
CPC ..................... H01H 1/00; H01H 13/70; H01H 13/702–13/704; H01H 2239/074;
(Continued)

(56) References Cited

U.S. PATENT DOCUMENTS

| 8,258,914 B2 * | 9/2012 | Kimura | G06F 3/045 |
| | | | 200/600 |
| 2012/0048706 A1 * | 3/2012 | Jung | H01H 13/85 |
| | | | 200/512 |
| 2012/0098551 A1 * | 4/2012 | Tsukamoto | G06F 3/044 |
| | | | 324/658 |

FOREIGN PATENT DOCUMENTS

| JP | 2009-172998 | 8/2009 |
| JP | 2011-013761 | 1/2011 |
| JP | 3167028 U | 3/2011 |

OTHER PUBLICATIONS

International Search Report (Form PCT/ISA/210) dated May 14, 2013 issued for PCT/JP2013/053982.

* cited by examiner

*Primary Examiner* — Anthony R. Jimenez
(74) *Attorney, Agent, or Firm* — Volpe and Koenig, P.C.

(57) ABSTRACT

[Object] To provide an input device, a display device, an electronic device, and a mobile terminal in which an opening of a decorative layer can be decorated while reducing a possibility of peeling off of a protective layer.
[Solution] An input device X1 includes a substrate 2, a first decorative layer 6 that is disposed on the substrate 2 and includes an opening 6a, a first protective layer 7 that is disposed on the first decorative layer 6 and is partially located inside the opening 6a, and a second decorative layer 8 disposed on the first protective layer 7, wherein the second decorative layer 8 is located so as to at least partially overlap the opening 6a in plan view.

16 Claims, 23 Drawing Sheets

(51) Int. Cl.
*G06F 3/041* (2006.01)
*H03K 17/16* (2006.01)
*G06F 1/16* (2006.01)
*G02F 1/1333* (2006.01)

(52) U.S. Cl.
CPC ......... *H03K 17/16* (2013.01); *G02F 1/13338* (2013.01); *H03K 2017/9613* (2013.01); *H03K 2217/960755* (2013.01); *H03K 2217/960765* (2013.01)

(58) Field of Classification Search
CPC ......... H01H 2203/008; H01H 2207/01; H01H 2221/00; H01H 2231/002; H01H 2231/012; H01H 2231/016; H01H 2231/052; H01H 2239/006; H01H 25/00; H01H 25/04; H01H 11/00; H01H 13/023; H01H 13/88; H01H 19/00–19/64; B32B 27/00; B32B 33/00; B41J 2/32; B41J 29/00; B41M 3/06; G06F 3/041; G06F 3/0412; G06F 3/045; G06F 2203/04101; G06F 2203/04107; G06F 2203/04111; H03K 17/975
USPC .... 200/600, 5 R, 592, 623.5, 829, 874, 877, 200/402.18, 428, 458, 469.5, 527.2; 345/173; 324/658, 691; 156/278; 73/431; 427/284, 287, 258, 256, 261, 427/264, 270, 271; 29/592, 623.5, 829, 29/874, 877, 402.18, 428, 458, 469.5, 29/527.2
See application file for complete search history.

INPUT DEVICE, DISPLAY DEVICE, ELECTRONIC DEVICE, AND MOBILE TERMINAL

TECHNICAL FIELD

The present invention relates to input devices, display devices, electronic devices and mobile terminals.

BACKGROUND ART

Input devices which include a decorative layer disposed on a substrate are known. In such input devices the decorative layer is, for example, composed of a first decorative layer and a second decorative layer. The first decorative layer has an opening. The opening is formed, for example, to indicate letters, figures or the like to a user. Further, the second decorative layer is formed to fill up the opening of the first decorative layer (for example, see PTL 1). Accordingly, the opening of the first decorative layer can be decorated by the second decorative layer. In addition, a protective layer is disposed on the decorative layer.

CITATION LIST

Patent Literature

PTL 1: Japanese Unexamined Patent Application Publication No. 2011-13761

SUMMARY OF INVENTION

Technical Problem

However, in the conventional input device, the second decorative layer may wet up on the surface of the first decorative layer due to an effect of surface tension during forming of the second decorative layer. As a result, part of the second decorative layer may be convex on the first decorative layer. In this state, when the protective layer is formed on the decorative layer, air bubbles may enter between the protective layer and the decorative layer. When air bubbles enter between the protective layer and the decorative layer, the protective layer may be peeled off.

The present invention is made in view of such circumstances, and an object of the invention is to provide an input device, a display device, an electronic device, and a mobile terminal in which an opening of a decorative layer can be decorated while reducing a possibility of peeling off of the protective layer.

Solution to Problem

According to one aspect of the present invention, an input device includes a substrate, a first decorative layer that is disposed on the substrate and includes an opening, a first protective layer that is disposed on the first decorative layer and is partially located inside the opening, and a second decorative layer disposed on the first protective layer, wherein the second decorative layer is located so as to at least partially overlap the opening in plan view.

According to one aspect of the present invention, a display device includes the input device according to the present invention, and a display panel which is disposed to oppose the input device.

According to one aspect of the present invention, an electronic device includes the display device according to the present invention, and a housing which houses the display device.

According to one aspect of the present invention, a mobile terminal includes the display device according to the present invention, a voice input unit, and a housing which houses the display device and the voice input unit.

Advantageous Effects of Invention

The input device, the display device, the electronic device, and the mobile terminal of the present invention have an effect that the opening of the decorative layer can be decorated while reducing the possibility of peeling off of the protective layer.

DESCRIPTION OF EMBODIMENTS

Figure 1:
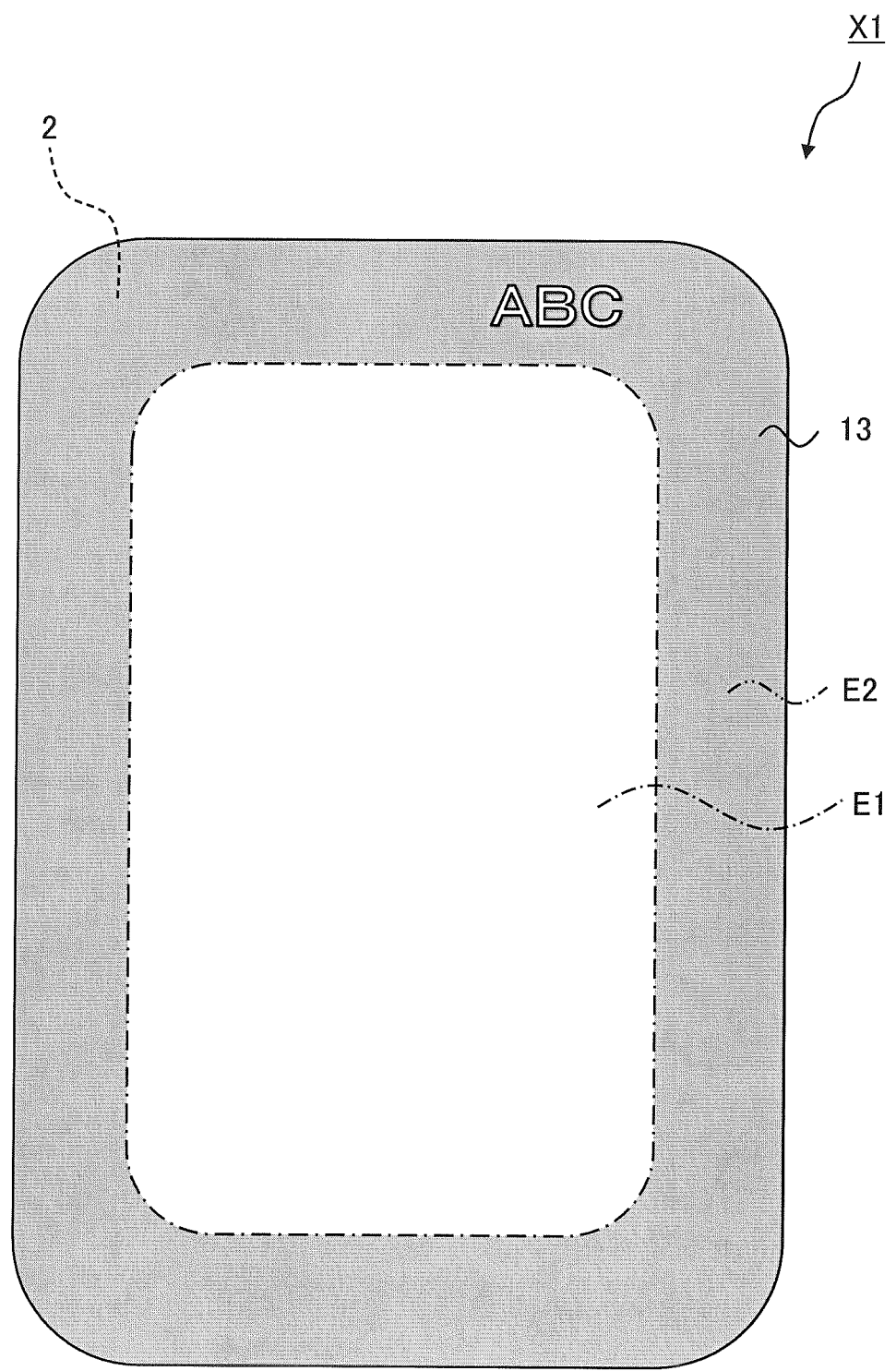
FIG. 1 is a plan view of a schematic configuration of an input device according to the present embodiment.

An embodiment of the present invention will be described below with reference to the drawings.

In the drawings herein referred to, for convenience of explanation, only main components which are necessary to explain the present invention are illustrated in a simplified manner among the components of the embodiment of the present invention. Accordingly, an input device, a display device, an electronic device and a mobile terminal according to the present invention may include any component not shown in the drawings herein.

Figure 2:
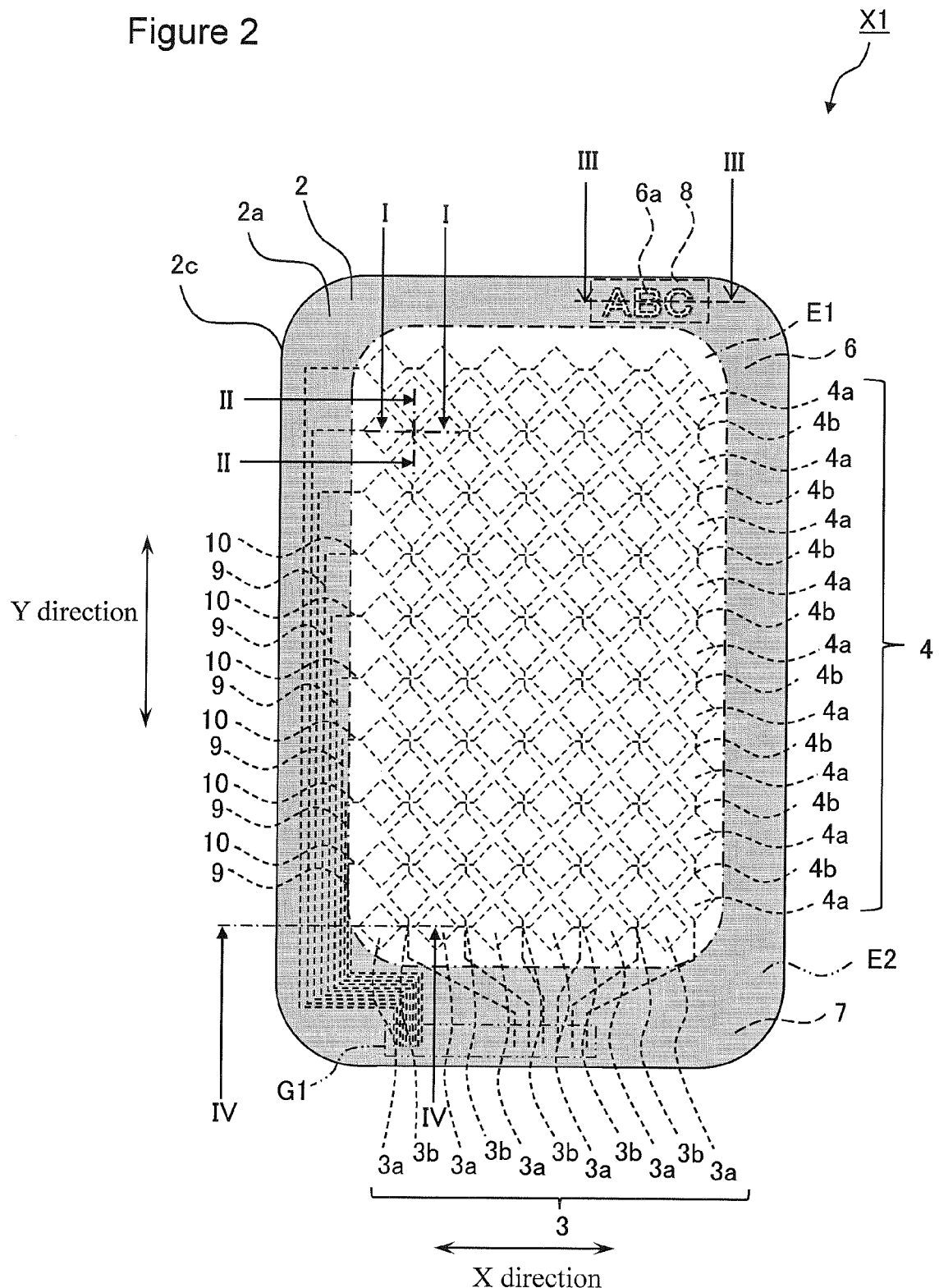
FIG. 2 is a plan view of the schematic configuration of the input device according to the present embodiment with a substrate transparently shown.
Figure 3:
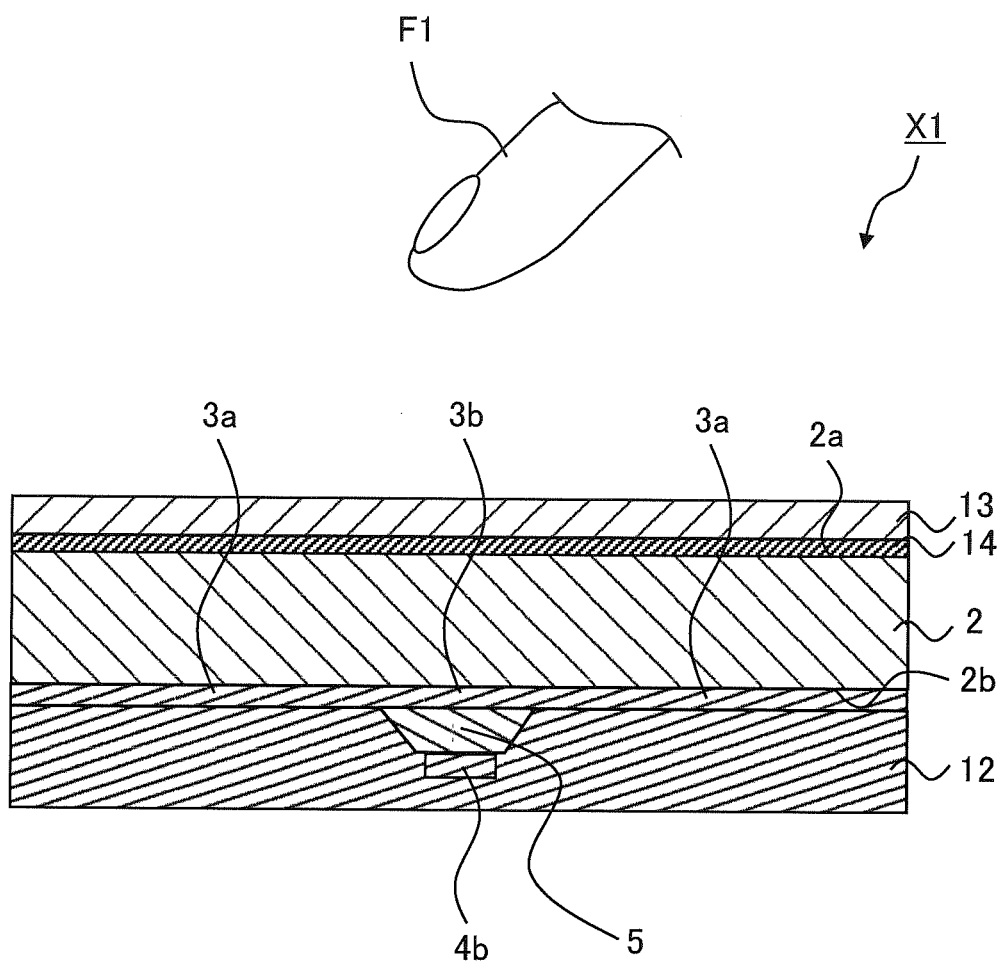
FIG. 3 is a sectional view taken along the line I-I of FIG. 2.
Figure 4:
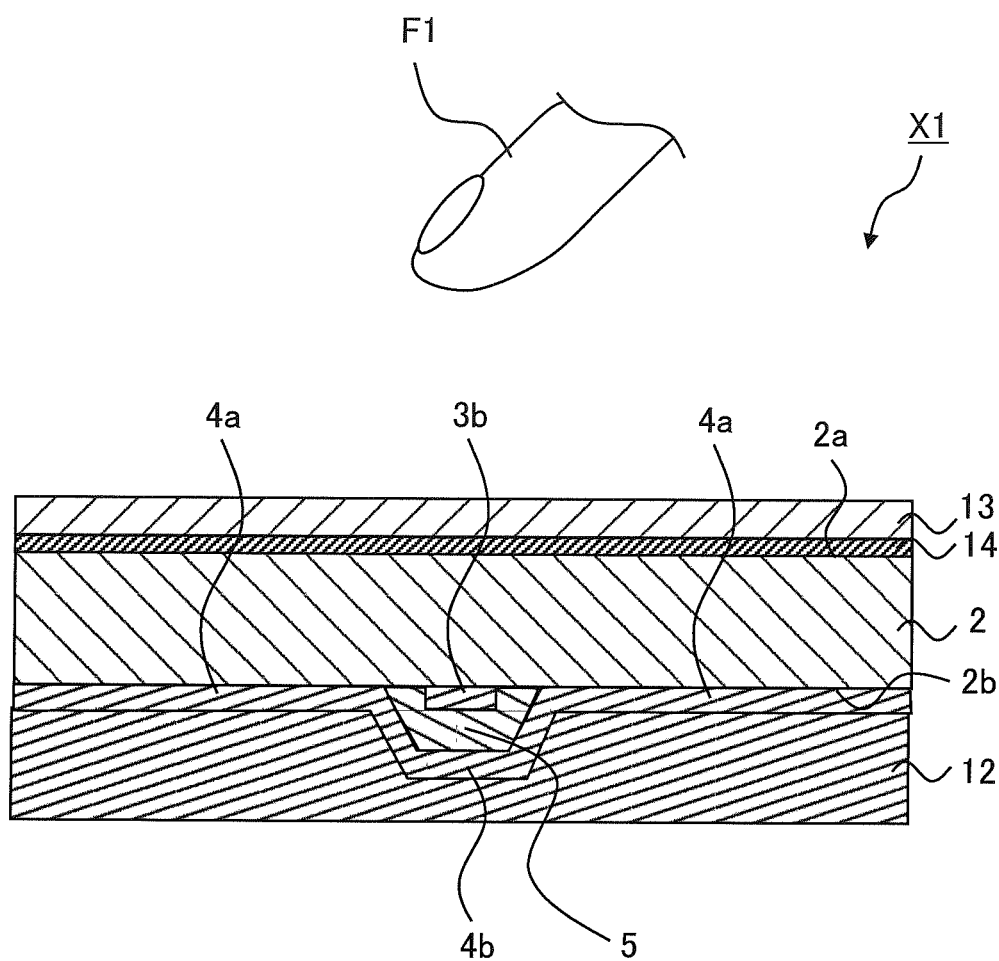
FIG. 4 is a sectional view taken along the line II-II of FIG. 2.

As shown in FIGS. 1 and 2, an input device X1 according to the present invention is a projected capacitive touch panel and includes an input area E1 and a non-input area E2. The input area E1 is an area on which a user can perform input operation. The non-input area E2 is an area on which a user cannot perform input operation. The non-input area E2 surrounds the input area E1 and is disposed outside the input area E1. The non-input area E2 may be disposed inside the input area E1. Further, the input device X1 is not limited to a projected capacitive touch panel, and may be, for example, a surface capacitive touch panel, a resistance film touch panel, a surface elastic wave touch panel, an optical touch panel, and an electromagnetic induction touch panel.

In this embodiment, the input device X1 is a cover glass-integrated capacitive touch panel, however it is not limited thereto. The input device X1 may be, for example, a laminate type or on-cell type capacitive touch panel.

As shown in FIGS. 1 to 6, the input device X1 includes a substrate 2.

The substrate 2 has a role of supporting a first detection electrode pattern 3, a second detection electrode pattern 4, an insulator 5, a first decorative layer 6, a first protective layer 7, a second decorative layer 8, detection wirings 9, connection wirings 10, a second protective layer 11, a third protective layer 12, a protective sheet 13 and an adhesive layer 14. In FIG. 2, for convenience of explanation, the insulator 5, the second protective layer 11, the third protective layer 12, the protective sheet 13 and the adhesive layer 14 are not illustrated.

The substrate 2 includes a first main surface 2a, a second main surface 2b and an end face 2c. The first main surface 2a is located on the side which allows the user to perform input operation with respect to the second main surface 2b. The second main surface 2b is located opposite to the first main surface 2a. The end face 2c is located between the first main surface 2a and the second main surface 2b. In this embodiment, an outer shape of the substrate 2 is a substantially rectangular shape in plan view. Accordingly, there are four end faces 2c corresponding to four sides of the substrate 2 in plan view. The outer shape of the substrate 2 may be a substantially polygonal shape, a substantially circular shape or the like in plan view.

The substrate 2 has an insulative property. The substrate 2 has a translucency to light incident in a direction which intersects with the first main surface 2a and the second main surface 2b. In this specification, the "translucency" means that part or all of visible light is allowed to pass.

In this embodiment, the substrate 2 has a substantially rectangular shape with rounded corners in plan view, however it is not limited thereto. The substrate 2 may be a substantially polygonal shape or a substantially circular shape in plan view. In this embodiment, a material of the substrate 2 is a glass. Specifically, the glass is preferably chemically strengthened by ion-exchange in order to increase the strength. In the case where the substrate 2 is made of a chemically strengthened glass, the chemically strengthened layer is included in the substrate 2. Further, a material of the substrate 2 may be plastics instead of glass.

The first detection electrode pattern 3 has a role of generating capacitance between itself and a user's finger F1 approaching the first main surface 2a of the substrate 2 which corresponds to the input area E1 and detecting an input position in the Y direction. A plurality of first detection electrode patterns 3 are arranged in the Y direction on the second main surface 2b of the substrate 2 which corresponds to the input area E1. Further, the first detection electrode pattern 3 includes first detection electrodes 3a and first inter-electrode wirings 3b.

The first detection electrodes 3a have a role of generating capacitance between the user's finger F1 and the first detection electrodes 3a. A plurality of first detection electrodes 3a are arranged in the X direction. The first inter-electrode wirings 3b have a role of electrically connecting the first detection electrodes 3a. The first inter-electrode wirings 3b are disposed between the first detection electrodes 3a adjacent to each other.

The second detection electrode pattern 4 has a role of generating capacitance between itself and the user's finger F1 approaching the first main surface 2a of the substrate 2 which corresponds to the input area E1 and detecting an input position in the X direction. A plurality of second detection electrode patterns 4 are arranged in the X direction on the second main surface 2b of the substrate 2 which corresponds to the input area E1. Further, the second detection electrode pattern 4 includes second detection electrodes 4a and second inter-electrode wirings 4b.

The second detection electrodes 4a have a role of generating capacitance between the user's finger F1 and the second detection electrodes 4a. A plurality of second detection electrodes 4a are arranged in the Y direction. The second inter-electrode wirings 4b have a role of electrically connecting the second detection electrodes 4a. The second inter-electrode wirings 4b are disposed on the insulator 5 between the second detection electrodes 4a adjacent to each other so as to be electrically isolated from the first inter-electrode wirings 3b with the insulator 5 therebetween. The insulator 5 is disposed on the second main surface 2b of the substrate 2 so as to cover the first inter-electrode wirings 3b. A material of the insulator 5 may include, for example, transparent resin such as acrylic resin, epoxy resin, silicone resin, silicon dioxide and silicon nitride.

While the shape of the first detection electrode 3a and the second detection electrode 4a of this embodiment is a substantially rhombic shape in plan view, it is not limited thereto, and may be a polygonal shape or a circular shape. By forming the first detection electrodes 3a and the second detection electrodes 4a in a substantially rhombic shape in plan view, a gap between the respective first detection electrodes 3a and the respective second detection electrodes 4a can be small. As a result, surface areas of the first detection electrodes 3a and the second detection electrodes 4a provided on the second main surface 2b of the substrate 2 may be relatively increased. This allows the capacitance generated between the first detection electrodes 3a, the second detection electrodes 4a and the finger F1 to be increased, thereby increasing a detection sensitivity of the input device X1.

A material of the first detection electrode pattern 3 and the second detection electrode pattern 4 includes a conductive member having translucency. The conductive member having translucency includes, for example, ITO (indium tin oxide), IZO (indium zinc oxide), ATO (Al-doped zinc oxide), tin oxide, zinc oxide, and conductive high molecule. Further, part of the first detection electrode pattern 3 and the second detection electrode pattern 4 may be formed of a thin metallic wire. A material of the thin metallic wire may include, for example, aluminum, silver, gold, and an alloy thereof.

As a forming method of the first detection electrode pattern 3 and the second detection electrode pattern 4 includes, for example, a film of the above material is formed on the second main surface 2b of the substrate 2 by a sputtering method, a vapor deposition method, or a CVD (chemical vapor deposition) method. Then, a photosensitive resin is coated on the surface of the film. The film is patterned through exposure, development and etching processes. Thus, the first detection electrode pattern 3 and the second detection electrode pattern 4 are formed.

The first decorative layer 6 has a role of decorating the non-input area E2. Further, the first decorative layer 6 has a role of blocking light incident in a direction which intersects with the first main surface 2a and the second main surface 2b of the substrate 2. In this specification, "blocking light" means that part or all of visible light is blocked by reflection or absorption. The first decorative layer 6 is disposed on the second main surface 2b of the substrate 2 which corresponds to the non-input area E2. Accordingly, the first decorative layer 6 is located on the side close to the end face 2c of the substrate 2 with respect to the first detection electrode pattern 3 and the second detection electrode pattern 4. In this embodiment, the first decorative layer 6 is disposed on the entire area which corresponds to the non-input area E2, however it is not limited thereto. The first decorative layer 6 may be disposed on an area which partially corresponds to the non-input area E2.

The first decorative layer 6 includes an opening 6a. The opening 6a has a role of, for example, indicating letters, figures or the like to the user. Accordingly, the opening 6a has a shape which shows specific letters, figures or the like in plan view. While the opening 6a in this embodiment has a shape of letters "ABC", it is not limited thereto. Further, while the opening 6a is arranged along the upper short side of the substrate 2 in plan view as shown in FIG. 2, it is not limited thereto. That is, any number, shape, or position may be used for the opening 6a.

A material of the first decorative layer 6 may include, for example, resin material containing coloring material. The resin material may include, for example, acrylic resin, epoxy resin, and silicone resin. The coloring material may include, for example, carbon, titanium, and chrome. The first decorative layer 6 is not limited to black, and may be colored with a color other than black. The first decorative layer 6 is formed by, for example, a screen printing method, a sputtering method, a CVD method, or a vapor deposition.

The first protective layer 7 has a role of protecting the first decorative layer 6. Protecting the first decorative layer 6 may include, for example, protection of the first decorative layer 6 from corrosion caused by water absorption. The first protective layer 7 is disposed on the second main surface 2b of the substrate 2 which corresponds to the non-input area E2. Specifically, the first protective layer 7 is disposed on the first decorative layer 6. Part of the first protective layer 7 is located on the opening 6a of the first decorative layer 6. In this embodiment, the first protective layer 7 covers the first decorative layer 6. Accordingly, the first decorative layer 6 can be sufficiently protected from corrosion caused by water absorption. Further, a possibility of alteration in material properties of the first decorative layer 6 can be reduced. In this embodiment, the first protective layer 7 which is disposed on the opening 6a of the first decorative layer 6 has a substantially flat surface. The first protective layer 7 has translucency. A material of the first protective layer 7 may include, for example, acrylic resin, silicone resin, rubber resin, urethane resin and resin containing silicon dioxide or silicon nitride. The first protective layer 7 is formed by, for example, transfer printing method, spin coating method or slit.

The second decorative layer 8 has a role of decorating the opening 6a of the first decorative layer 6. The second decorative layer 8 is disposed on the second main surface 2b of the substrate 2 which corresponds to the non-input area E2. Specifically, the second decorative layer 8 is provided on the first protective layer 7. Part of the second decorative layer 8 is located to overlap the opening 6a of the first decorative layer 6 in plan view. A material of the second decorative layer 8 may include the same materials as those of the first decorative layer 6.

The second decorative layer 8 may be formed by the same methods as those of the first decorative layer 6. Further, the second decorative layer 8 may be formed of a metal thin film. A material for the metal thin film may include, for example, an aluminum film, an aluminum alloy film, a laminate film of a chrome film and an aluminum film, a laminate film of a chrome film and an aluminum alloy film, a silver film, a sliver alloy film, or a gold alloy film. The metal thin film is formed by, for example, a sputtering method, a CVD method, or a vapor deposition method.

As described above, in the input device X1, the first protective layer 7 is disposed on the first decorative layer 6. Part of the first protective layer 7 is located inside the opening 6a of the first decorative layer 6. The second decorative layer 8 is disposed on the first protective layer 7. The second decorative layer 8 is located to overlap the opening 6a of the first decorative layer 6 in plan view. Accordingly, in the input device X1, the opening 6a of the first decorative layer 6 can be decorated while reducing a possibility of peeling off of the first protective layer 7. The reasons will be explained below in detail.

Figure 7:
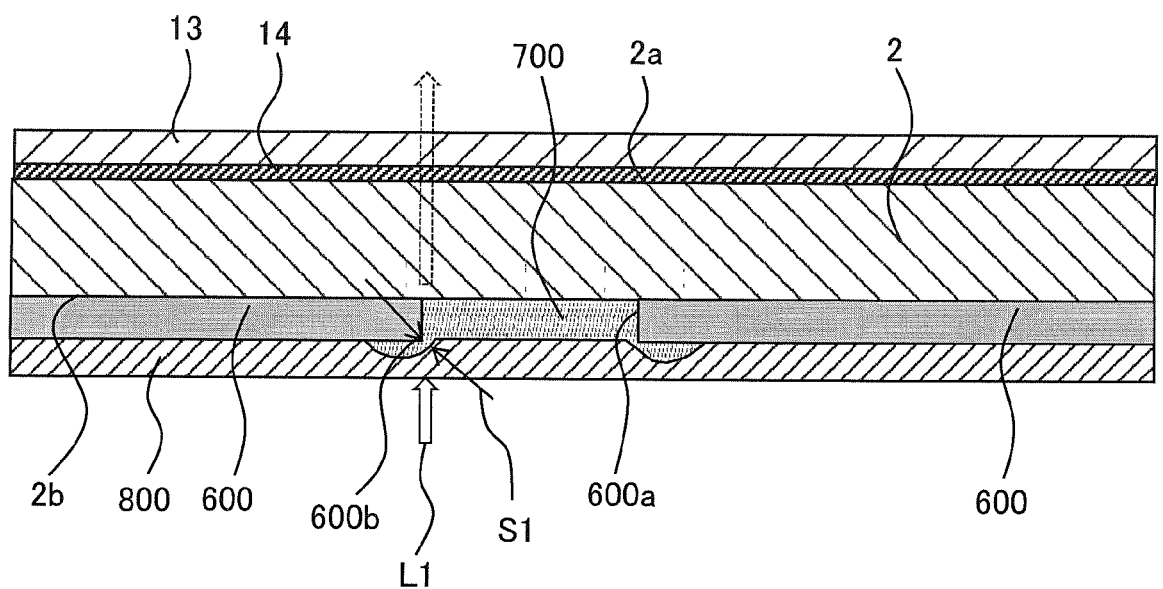
FIG. 7 is a sectional view of a schematic configuration of a prior input device.

In the conventional input device shown in FIG. 7, when the opening 600a of the first decorative layer 600 is filled with the second decorative layer 700, part of the second decorative layer 700 may wet up on the first decorative layer 600 due to surface tension. When part of the second decorative layer 700 wets up on the first decorative layer 600, the thickness of the wetted second decorative layer 700 becomes larger than the thickness of the first decorative layer 600. That is, part of the second decorative layer 700 forms a convex shape on the first decorative layer 600. When the first protective layer 800 is provided on the first decorative layer 600 and the second decorative layer 700 which are formed in such a state, air bubbles may enter between the first protective layer 800 and the first decorative layer 600, the second decorative layer 700 since part of the second decorative layer 700 is in a convex shape. When air bubbles enter between the first protective layer 800 and the first decorative layer 600, the second decorative layer 700, this may cause the first protective layer 800 to be peeled off.

Specifically, in the case where the first decorative layer 6 is disposed on the second main surface 2b of the substrate 2 as shown in this embodiment, the first decorative layer 6 is located on the side away from the first main surface 2a. Further, in the case where the first decorative layer 6 is disposed on the side close to the end face 2c of the substrate 2 with respect to the first detection electrode pattern 3 and the second detection electrode pattern 4 as shown in this embodiment, the opening 6a is located on the side close to the end face 2c of the substrate 2. In this case, the second main surface 2b which is located in vicinity to the end face 2c of the substrate 2 is an area on which a stress tends to be focused when the first main surface 2a of the substrate 2 which corresponds to the input area E1 is pressed. Accordingly, a member located on the opening 6a tends to be easily peeled off.

Thus, in the input device X1, part of the first protective layer 7 is located inside the opening 6a of the first decorative layer 6. Accordingly, the adhesion strength of the first protective layer 7 to the first decorative layer 6 can be improved by an anchor effect. Moreover, the second decorative layer 8 is disposed on the first protective layer 7. The second decorative layer 8 is located to overlap the opening 6a of the first decorative layer 6 in plan view. Accordingly, the second decorative layer 8 can decorate the opening 6a of the first decorative layer 6 through the first protective layer 7. Thus, in the input device X1, the opening 6a of the first decorative layer 6 can be decorated while reducing a possibility of peeling off of the first protective layer 7.

In the conventional input device, the adhesive strength of the second decorative layer 700 to a corner 600b of the first decorative layer 600 is small. As a consequence, a thickness S1 of the second decorative layer 700 which is disposed on the corner 600b of the first decorative layer 600 may become relatively small. As the thickness S1 becomes relatively small, when the input device is incorporated in the display device, a light L1 emitted from the backlight disposed on the side of the second main surface 2b of the substrate 2 may be viewed by the user through between the first decorative layer 600 and the second decorative layer 700 via the second decorative layer 700 disposed on the corner 600b of the first decorative layer 600.

On the other hand, in the input device X1 according to this embodiment, the second decorative layer 8 is disposed on the first protective layer 7. The first protective layer 7 is disposed on the first decorative layer 6 and fills the opening 6a of the first decorative layer 6 so that the surface of the first protective layer 7 located on the opening 6a forms a substantially flat surface. Accordingly, the second decorative layer 8 has a substantially uniform thickness. As a consequence, when the input device X1 is incorporated in a display device Y1, a possibility that light emitted from a backlight 300 disposed on the side of the second main surface 2b of the substrate 2 is viewed by the user through between the first decorative layer 6 and the second decorative layer 8 can be reduced.

While one second decorative layer 8 is disposed in this embodiment, the number is not limited thereto and a plurality of second decorative layers 8 may be provided. In this case, a plurality of second decorative layers 8 can be colored with different colors so that the openings 6a of the first decorative layer 6 are colored with different colors. Accordingly, the design of the input device X1 can be improved.

It is preferable that the second decorative layer 8 is colored with a color different from that of the first decorative layer 6. When the second decorative layer 8 is colored with a color different from that of the first decorative layer 6, an area of the first decorative layer 6 outside the opening 6a can be colored with a color different from that of an area in which the opening 6a is located in plan view. Accordingly, the design of the input device X1 can be improved. The "different color" as used herein means, for example, colors that are different in any of hue, value, and chroma of the Munsell color system.

Further, a material of the second decorative layer 8 may be a coloring material having translucency. Since the second decorative layer 8 is made of a coloring material having translucency, for example, when the input device X1 is incorporated in the display device Y1, light emitted from the backlight 300 disposed on the side of the second main surface 2b of the substrate 2 is viewed by the user through the opening 6a of the first decorative layer 6 via the second decorative layer 8 and the first protective layer 7. In this case, the light viewed by the user is in a color of the second decorative layer 8, which contribute to improve the design of the input device X1. The coloring material having translucency may include, for example, epoxy resin and acrylic resin in which the pigment of a specific color is blended.

The detection wirings 9 have a role of detecting a change in capacitance generated between the finger F1 and the first detection electrode pattern 3, the second detection electrode pattern 4. The detection wirings 9 are disposed on the second main surface 2b of the substrate 2 which corresponds to the non-input area E2. Specifically, the detection wirings 9 are disposed on the first protective layer 7. Accordingly, even if coloring material in the first decorative layer 6 has a conductive property, the first decorative layer 6 can be electrically isolated from the detection wirings. Further, the detection wirings 9 are disposed on the first decorative layer 6 outside the opening 6a. Accordingly, a possibility that detection wirings 9 are viewed by the user can be reduced. Further, one end of the respective detection wirings 9 is located in an outside conduction area G1 on the second main surface 2b of the substrate 2. The other end of the respective detection wirings 9 is connected to the respective connection wirings 10.

The detection wirings 9 may be made of a material same as that of the second decorative layer 8. In the case where the detection wirings 9 and the second decorative layer 8 are made of the same material, the detection wirings 9 and the second decorative layer 8 can be simultaneously manufactured by the same manufacturing process. In particular, in the case where the detection wirings 9 and the second decorative layer 8 are disposed on the front side of the first protective layer 7 as shown in this embodiment, the detection wirings 9 and the second decorative layer 8 can be simultaneously manufactured after the first protective layer 7 is formed. Accordingly, the manufacturing process can be reduced.

The detection wirings 9 are formed of a thin metallic wire in order to obtain hardness and high shape stability. A material and forming method of the thin metallic wire may include the same materials and methods as those of the second decorative layer 8.

Figure 6:
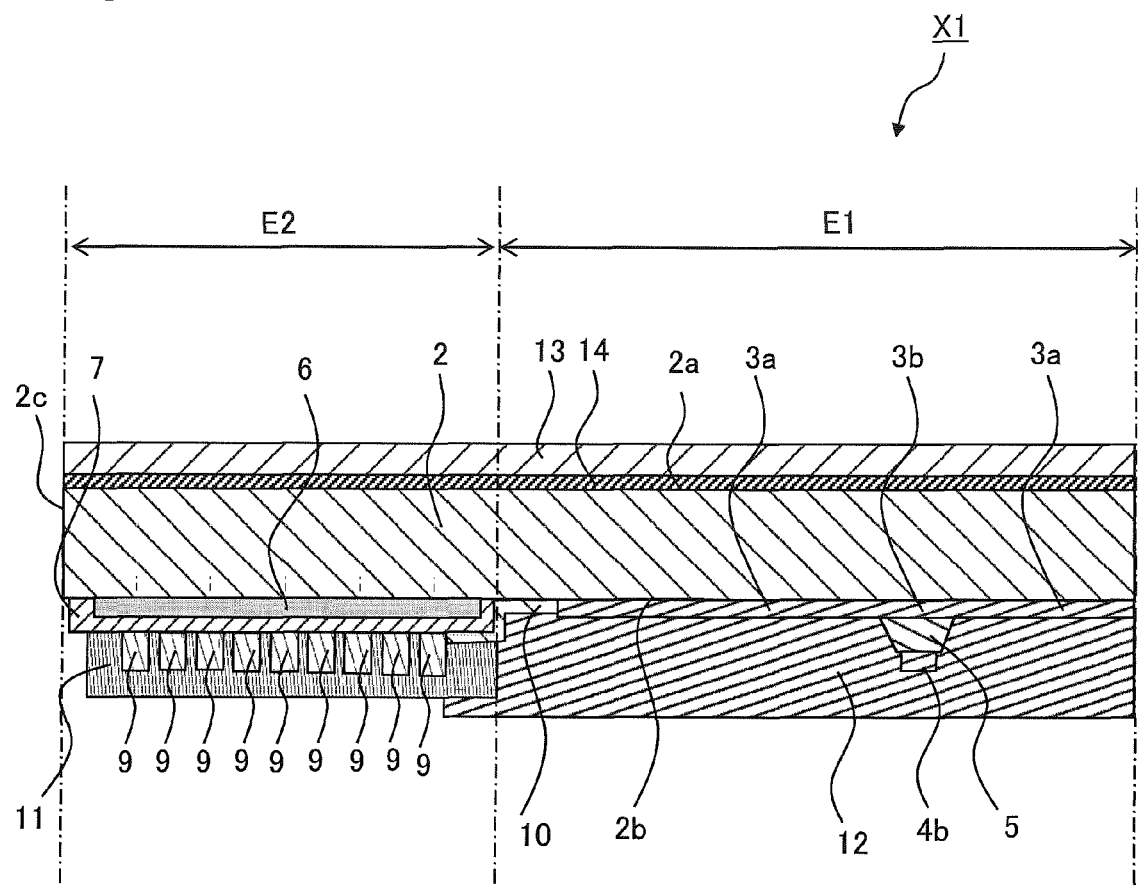
FIG. 6 is a sectional view taken along the line IV-IV of FIG. 2.

The connection wirings 10 have a role of electrically connecting the first detection electrode pattern 3 to the detection wirings 9. Further, the connection wirings 10 have a role of electrically connecting the second detection electrode pattern 4 to the detection wirings 9. As shown in FIG. 6, the connection wirings 10 are disposed on the second main surface 2b of the substrate 2 and extend from the input area E1 to the non-input area E2. The connection wirings 10 connect the first detection electrodes 3a located on one end of the first detection electrode pattern 3 to the detection wirings 9. Further, the connection wirings 10 connect the second detection electrodes 4a located on one end of the second detection electrode pattern 4 to the detection wirings 9. A material and forming method of the connection wirings 10 may include the same materials and methods as those of the first detection electrode pattern 3 and the second detection electrode pattern 4.

The second protective layer 11 has a role of protecting the detection wirings 9. Protecting the detection wirings 9 may include, for example, protection of the detection wirings 9 from corrosion caused by water absorption. The second protective layer 11 is disposed on the first protective layer 7 in the non-input area E2. Further, the second protective layer 11 covers the detection wirings 9. Accordingly, the detection wirings 9 can be sufficiently protected from corrosion caused by water absorption. A material and forming method of the second protective layer 11 may include the same materials and methods as those of the first protective layer 7.

The third protective layer 12 has a role of protecting the first detection electrode pattern 3 and the second detection electrode pattern 4. Protecting the first detection electrode pattern 3 and the second detection electrode pattern 4 may include, for example, protection of the first detection electrode pattern 3 and the second detection electrode pattern 4 from a damage caused by an external shock. The third protective layer 12 further has a role of protecting the first detection electrode pattern 3 and the second detection electrode pattern 4 from corrosion caused by water absorption. The third protective layer 12 is disposed on the second main surface 2b of the substrate 2 which corresponds to the input area E1 and part of the non-input area E2, and covers the first detection electrode pattern 3, the second detection electrode pattern 4, the insulator 5, and the connection wirings 9. Further, while the input device X1 of this embodiment includes the second protective layer 11 and the third protective layer 12, it is not limited thereto and the second protective layer 11 and third protective layer 12 may by a single member. A material and forming method of the third protective layer 12 may include the same materials and methods as those of the first protective layer 7.

The protective sheet 13 has a role of protecting the first main surface 2a of the substrate 2 from a damage caused by the contact of the user's finger F1. The protective sheet 13 is disposed on the entire area of the first main surface 2a of the substrate 2 which corresponds to the input area E1 and the non-input area E2 with the adhesive layer 14 therebetween. Further, the protective sheet 13 may be disposed on the area of the first main surface 2a of the substrate 2 which corresponds only to the input area E1. A material of the protective sheet 13 may include, for example, glass and plastics. Further, a material of the adhesive layer 14 may include, for example, acrylic adhesive material, silicone adhesive material, rubber adhesive material, and urethane adhesive material.

Next, the principal of detection of the input device X1 will be described.

A detection driver, which is not shown in the figure, is electrically connected to the detection wirings 9 which are located in the outside conduction area G1. Further, a power supply, which is not shown in the figure, supplies voltage to the first detection electrode pattern 3 and the second detection electrode pattern 4. When the finger F1, which is a conductor, approaches, abuts, or presses the first main surface 2a of the substrate 2 which corresponds to the input area E1 via the protective sheet 13, capacitance is generated between the finger F1 and the first detection electrodes 3a, the second detection electrodes 4a. The position detection driver constantly detects the capacitance which is generated at the first detection electrode pattern 3 and the second detection electrode pattern 4, and detects the input position in which the user performed the input operation based on the combination of the first detection electrode pattern 3 and the second detection electrode pattern 4 at which a specific amount of capacitance or more is detected. In this manner, the input device X1 can detect the input position.

As mentioned above, in the input device X1, the opening 6a of the first decorative layer 6 can be decorated while reducing a possibility of peeling off of the first protective layer 7.

Next, the display device Y1 which includes the input device X1 will be described with reference to FIG. 8.

Figure 8:
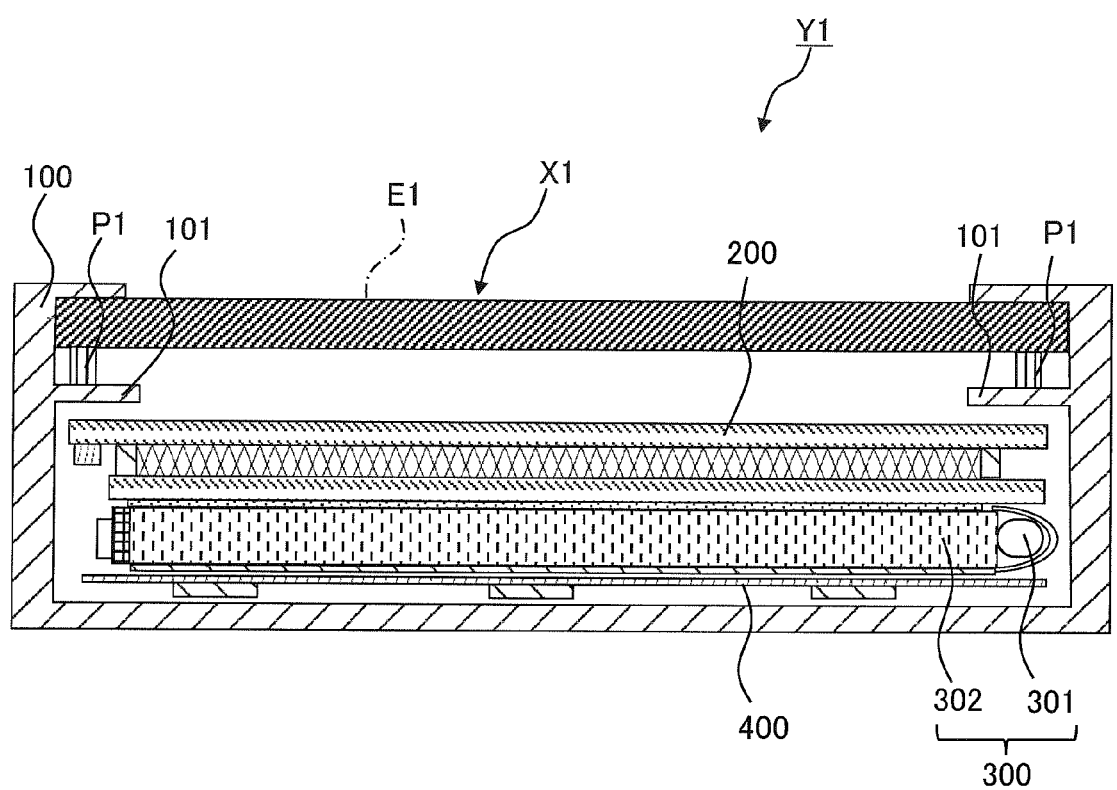
FIG. 8 is a sectional view of a schematic configuration of a display device according to the present embodiment.

As shown in FIG. 8, the display device Y1 according to this embodiment includes the input device X1, a first housing 100, a display panel 200, the backlight 300, and a circuit board 400.

The input device X1 is housed in the first housing 100 so that the input area E1 is exposed. A material of the first housing 100 may include, for example, a resin such as polycarbonate and a metal such as stainless and aluminum. Further, the input device X1 is disposed on a support section 101 of the first housing 100 with a support member P1 therebetween. Further, the support member P1 may not be provided, and the input device X1 may be directly disposed on the support section 101 of the first housing 100.

The display panel 200 has a role of displaying an image or a video. The display panel 200 is disposed to oppose the input device X1 and is housed in the first housing 100. Further, while the input device X1 is spaced from the display panel 200 by a specific distance, however it is not limited thereto and the input device X1 may be directly disposed on the display panel 200 via a fixation member. The fixation member may include, for example, a double sided tape, a thermosetting resin, an ultraviolet-curing resin, and a fastener such as a screw. Further, while the display panel 200 in this embodiment is a liquid crystal panel using a liquid crystal structure, it is not limited thereto and may be a plasma display, an organic EL display, an FED (field emission display), an SED (surface-conduction electron-emitter display), and an electric paper.

The backlight 300 has a role of emitting light to the entire surface of the underside of the display panel 200. The backlight 300 is disposed on the back side of the display panel 200. The backlight 300 includes a light source 301 and a light guide plate 302. The light source 301 has a role of emitting light toward the light guide plate 302 and is formed of an LED (light emitting diode). In addition, the light source 301 may not be formed of an LED and may be formed of, for example, a cold cathode fluorescent lamp, a halogen lamp, a xenon lamp, or an EL (electro-luminescence). The light guide plate 302 has a role of substantially uniformly guiding light from the light source 301 to the entire surface of the underside of the display panel 200. In addition, when a display panel which uses a light emission element is used instead of the display panel 200, the backlight 300 may not be provided.

The circuit board 400 has a role of supporting electronic elements such as a controller which controls the display panel 200 and the backlight 300, a resistor, and a capacitor. The circuit board 400 is disposed on the back side of the backlight 300. A control circuit on the circuit board 400 is electrically connected to the display panel 200 and the backlight 300 via a flexible printed wiring board and the like, which is not shown in the figure. Further, the circuit board 400 may include the above position detection driver. In this case, the position detection driver on the circuit board 400 is electrically connected to the detection wirings 9 which are located in the outside conduction area G1 via a flexible printed wiring board and the like, which is not shown in the figure. Further, a plurality of circuit boards 400 may be provided. A material of the circuit board 400 may include, for example, a resin material.

Accordingly, various information can be input in the display device Y1 by performing the input operation on the input area E1 of the input device X1 while seeing the display panel 200 through the input device X1. The input device X1 may have a function to provide various feelings, such as the feel of pressing, tracking and touching, to the user who is inputting various information. This can be achieved by providing an oscillator or a plurality of oscillators (for example, piezoelectric elements) on the substrate 2 in the input device X1 so that they oscillate at a predetermined frequency when a predetermined input operation or a predetermined pressing load can be detected.

As described above, since the display device Y1 includes the input device X1, the opening 6a of the first decorative layer 6 can be decorated while reducing a possibility of peeling off of the first protective layer 7.

Next, a mobile terminal Z1 which includes the display device Y1 will be described with reference to FIG. 9.

Figure 9:
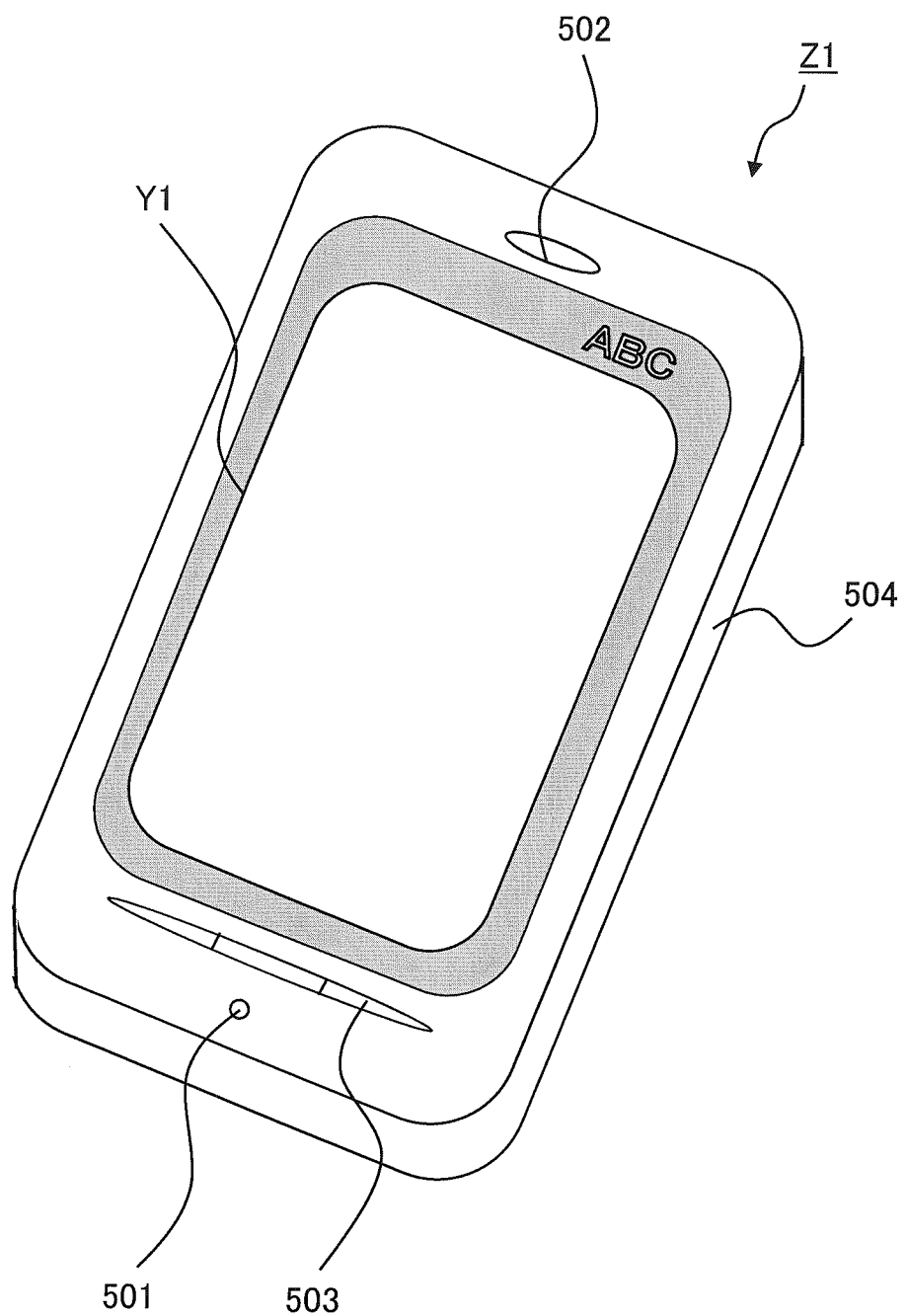
FIG. 9 is a perspective view of a schematic configuration of a mobile terminal mobile terminal embodiment.

As shown in FIG. 9, the mobile terminal Z1 according to this embodiment is a smart phone terminal. Further, the mobile terminal Z1 is not limited to a smart phone terminal, and may be, for example, a cell phone, a tablet terminal, or a PDA (personal digital assistant). The mobile terminal Z1 includes the display device Y1, a voice input unit 501, a voice output unit 502, a key input unit 503, and a second housing 504. Further, an embodiment of the electronic device according to the present invention is the display device Y1 and the second housing 504.

The voice input unit 501 has a role of receiving the user's voice or the like, and is composed of a microphone or the like. The voice output unit 502 has a role of outputting the voices or the like of a person on the line, and is composed of an electromagnetic speaker, a piezoelectric speaker or the like. The key input unit 503 is composed of mechanical keys. The key input unit 503 may be operation keys displayed on the display screen. The second housing 504 has a role of housing the display device Y1, the voice input unit 501, the voice output unit 502, and the key input unit 503. Further, the second housing 504 may not be provided, and the first housing 100 of the display device Y1 may house the voice input unit 501, the voice output unit 502, and the key input unit 503. A material of the second housing 504 may include the same materials and methods as those of the first housing 100.

In addition, the mobile terminal Z1 may include a digital camera function, a tuner for one-segment broadcasting, a short-range wireless communication section such as an infrared communicating function, a wireless LAN module, a Bluetooth module, and various interfaces depending on necessary functions. However, the detail illustration and description for those are omitted.

As described above, since the mobile terminal Z1 includes the display device Y1, the opening 6a of the first decorative layer 6 can be decorated while reducing a possibility of peeling off of the first protective layer 7.

The display device Y1 may be provided not only in the above mobile terminal Z1 but also in various electronic devices such as a programmable display used for industrial application, an electronic organizer, a personal computer, a copying machine, a terminal for game machine, a television, and a digital camera.

The foregoing embodiment is an illustrative example of the present invention, and various modifications can be made thereto. Some typical modifications will be described below.

Modification 1

Figure 10:
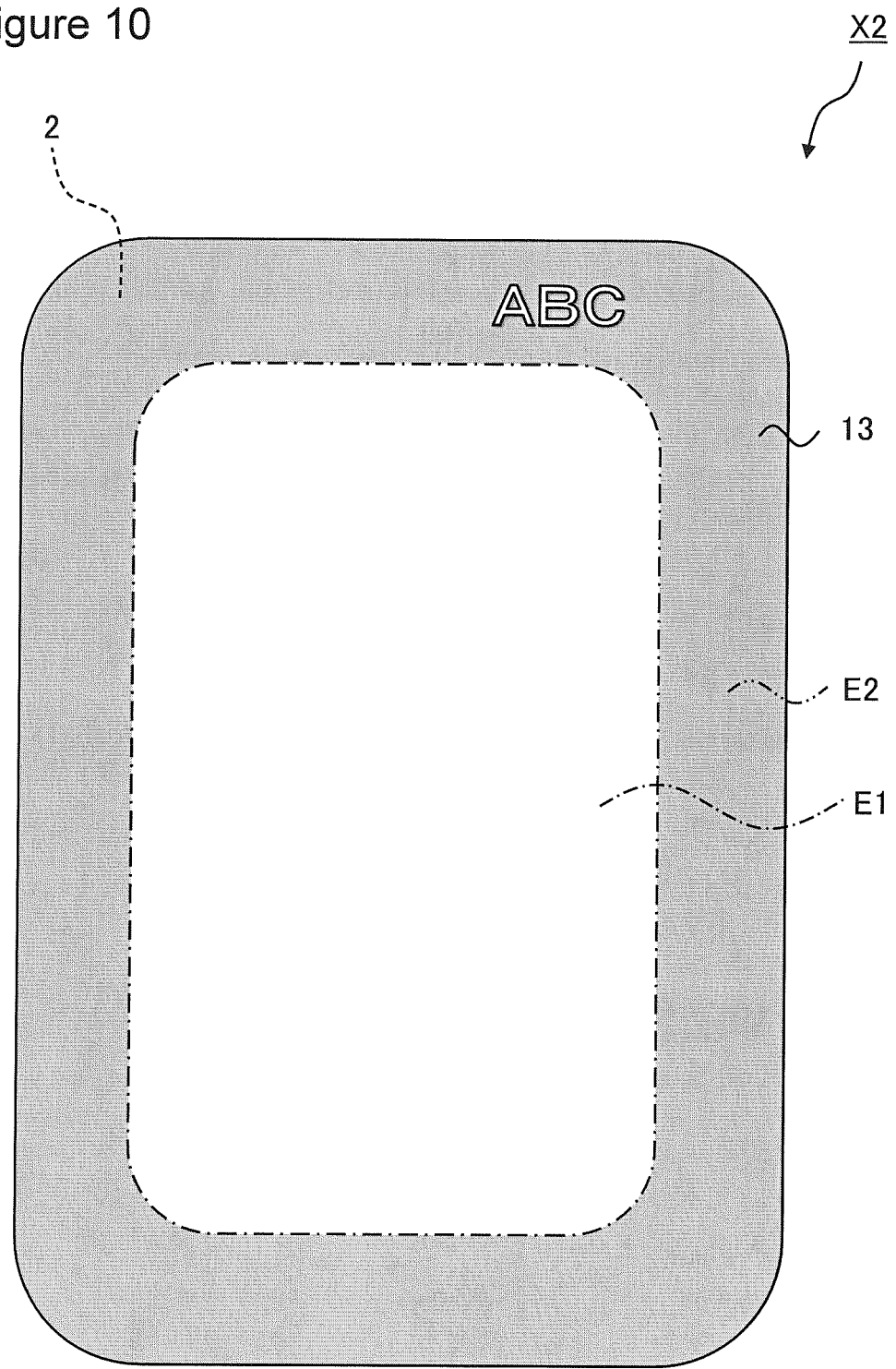
FIG. 10 is a plan view of a schematic configuration of an input device according to Modification 1.
Figure 11:
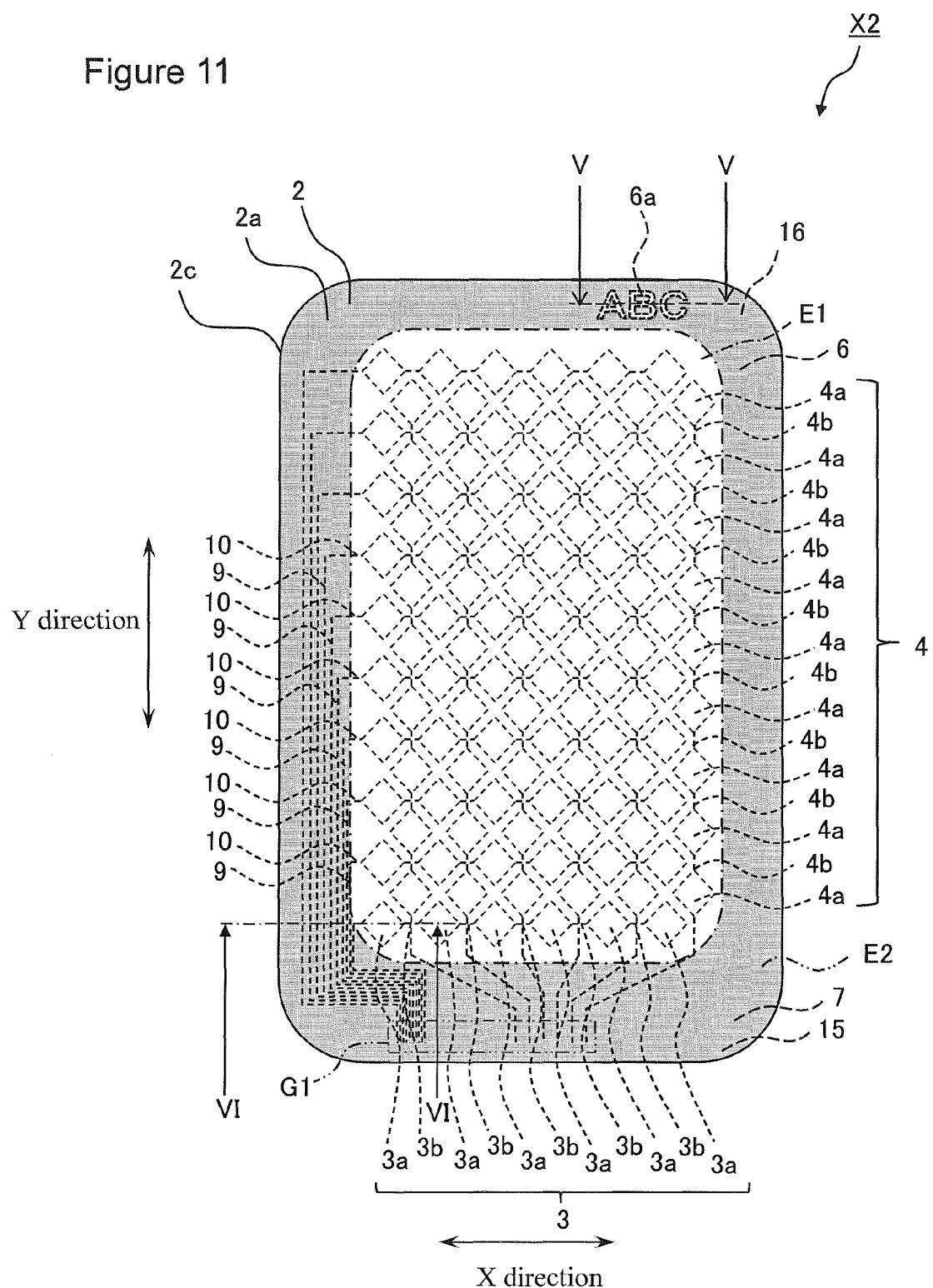
FIG. 11 is a plan view of the schematic configuration of the input device according to Modification 1 with the substrate transparently shown.
Figure 12:
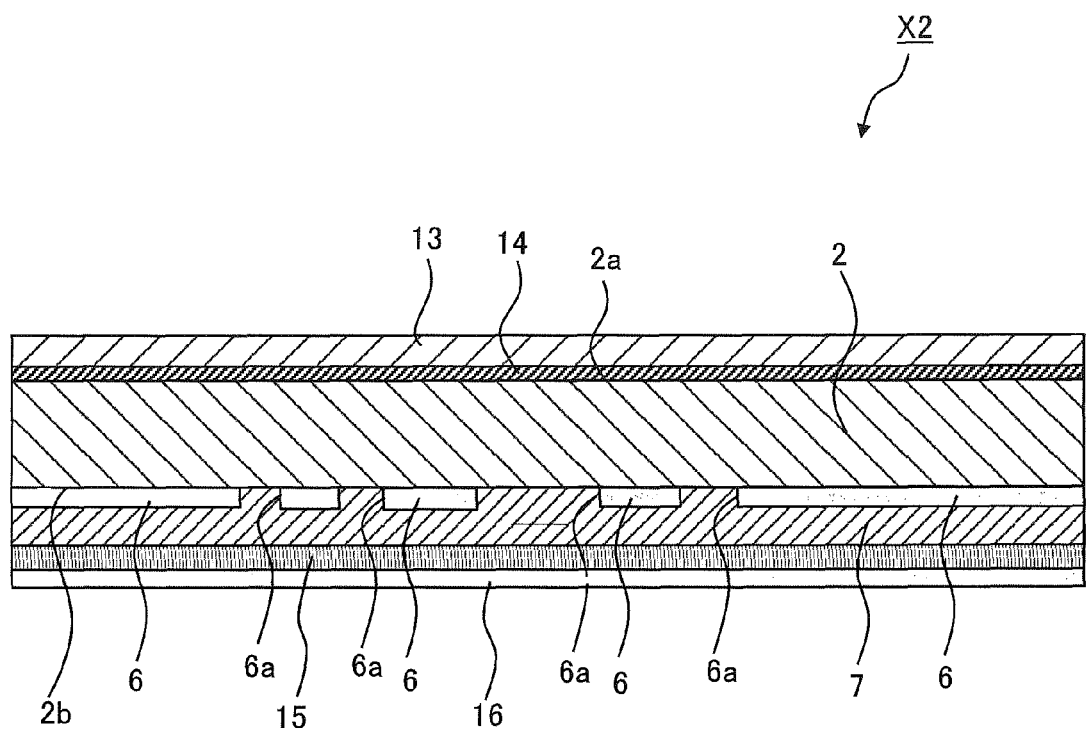
FIG. 12 is a sectional view taken along the line V-V of FIG. 11.
Figure 13:
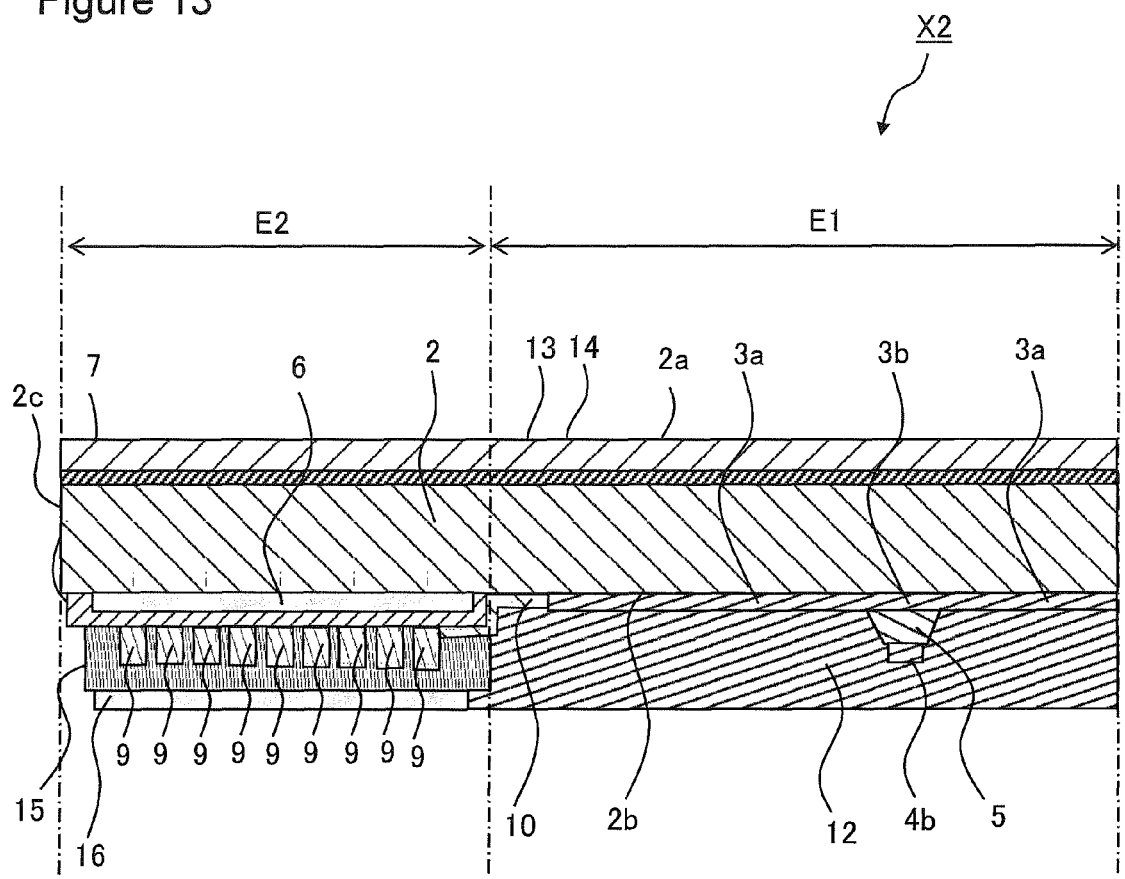
FIG. 13 is a sectional view taken along the line VI-VI of FIG. 11.

FIG. 10 is a plan view of a schematic configuration of an input device X2 according to Modification 1. FIG. 11 is a plan view of the schematic configuration of the input device X2 according to Modification 1 with the substrate 2 transparently shown. FIG. 12 is a sectional view taken along the line V-V of FIG. 11. FIG. 13 is a sectional view taken along the line VI-VI of FIG. 11. In FIGS. 10 to 13, the components having the same functions as those of FIGS. 1, 2, 5, and 6 are denoted by the same reference numerals, and detailed description thereof is omitted. Further, in FIG. 11, for convenience of explanation, the insulator 5, the third protective layer 12, the protective sheet 13, and the adhesive layer 14 are not illustrated.

As shown in FIGS. 10 to 13, in the input device X2, a second protective layer 15 is provided instead of the second protective layer 11 of the input device X1. Further, a second decorative layer 16 is provided instead of the second decorative layer 8 of the input device X1.

The second protective layer 15 is disposed on the entire area of the first protective layer 7 in the non-input area E2. The second protective layer 15 covers the detection wirings 9. The second decorative layer 16 is disposed on the second protective layer 15 and covers the opening 6a of the first decorative layer 6 and the detection wirings 9 in plan view. Accordingly, the second decorative layer 16 can decorate the opening 6a of the first decorative layer 6 while blocking light incident to the detection wirings 9 through the second main surface 2b of the substrate 2. As a result, for example, when the input device X2 is incorporated in the display device, the light emitted from the backlight of the display device to the detection wirings 9 can be blocked by the first decorative layer 6 and the second decorative layer 16.

As described above, according to the input device X2, even if the amount of light emitted from the backlight to the detection wirings 9 is relatively large, a possibility that the detection wirings 9 are viewed by the user can be reduced.

Moreover, according to Modification 1, an area in which the first decorative layer 6 is located and an area in which the second decorative layer 16 is located are substantially the same. Accordingly, since the area in which the first decorative layer 6 is located and the area in which the second decorative layer 16 is located can equally block light, a visibility of the non-input area E2 of the input device X2 is improved. Further, the second decorative layer 16 may be located outside the area in which the first decorative layer 6 is located. In this case, the input device X2 includes an area in which the first decorative layer 6 overlaps the second decorative layer 16 and an area in which the second decorative layer 16 is located. Accordingly, the input device X2 may include two areas of different shades by having different permeability. Accordingly, the design of the input device X2 can be improved.

Modification 2

Figure 14:
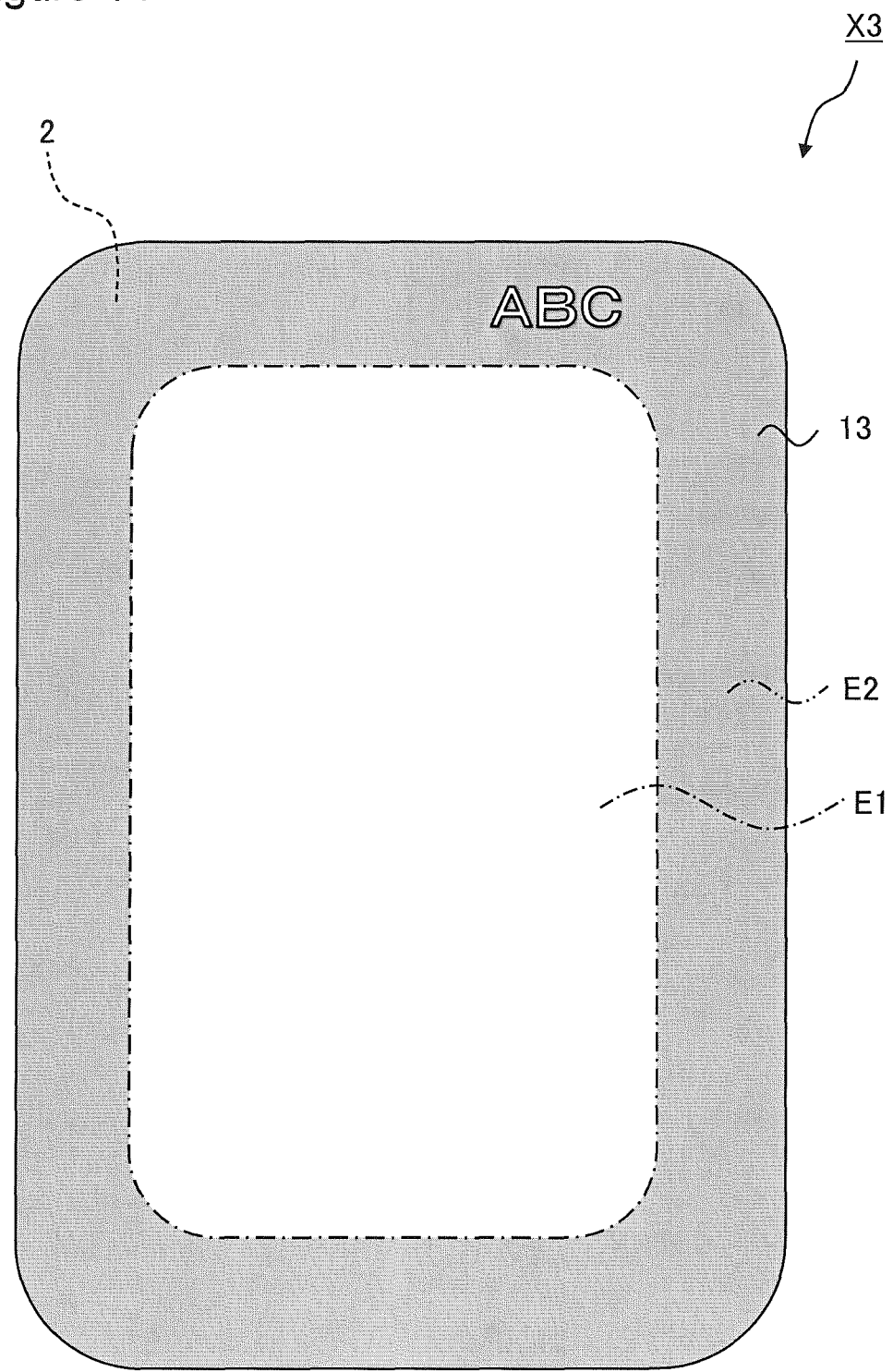
FIG. 14 is a plan view of a schematic configuration of an input device according to Modification 2.
Figure 15:
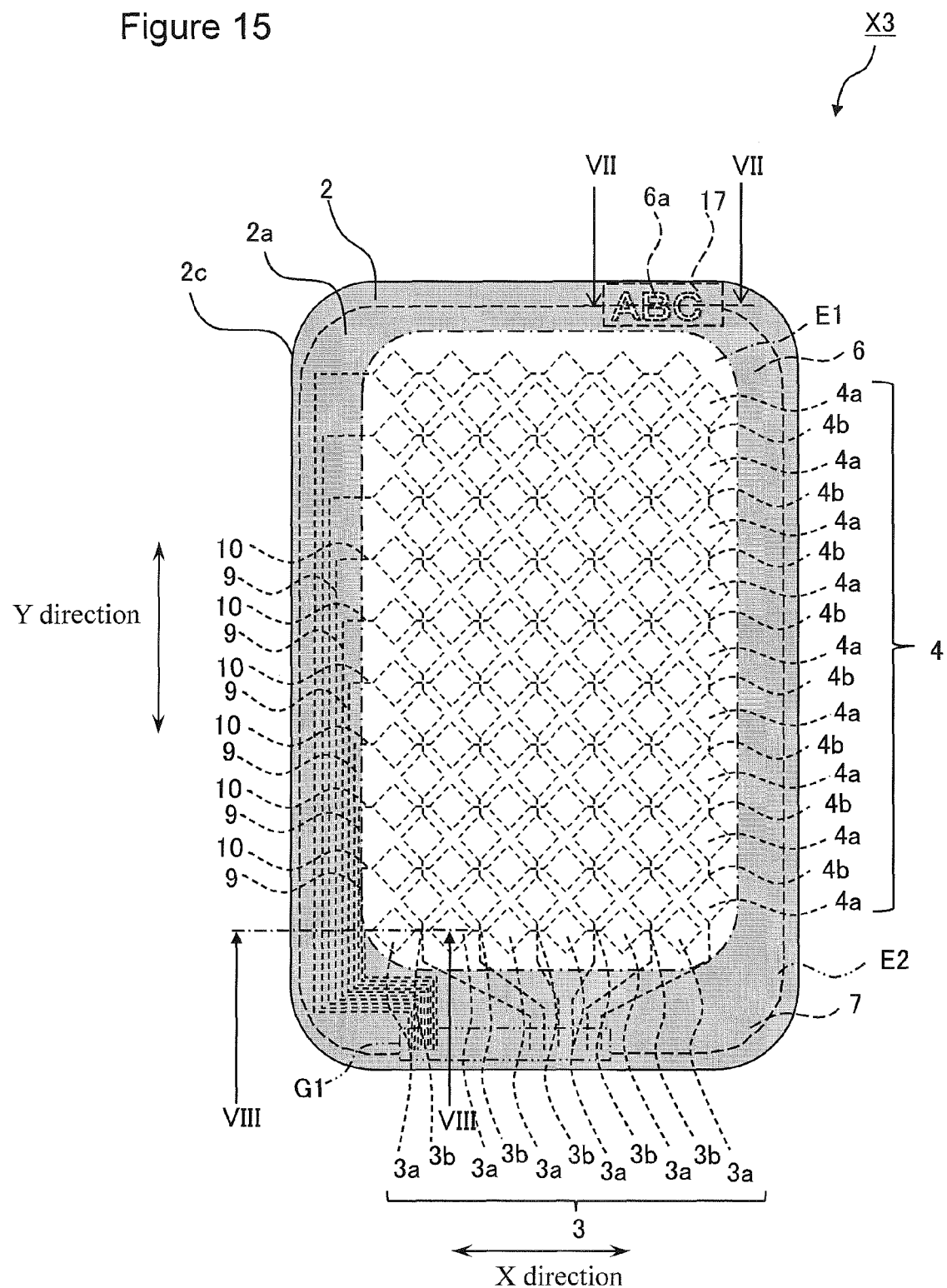
FIG. 15 is a plan view of the schematic configuration of the input device according to Modification 2 with the substrate transparently shown.
Figure 16:
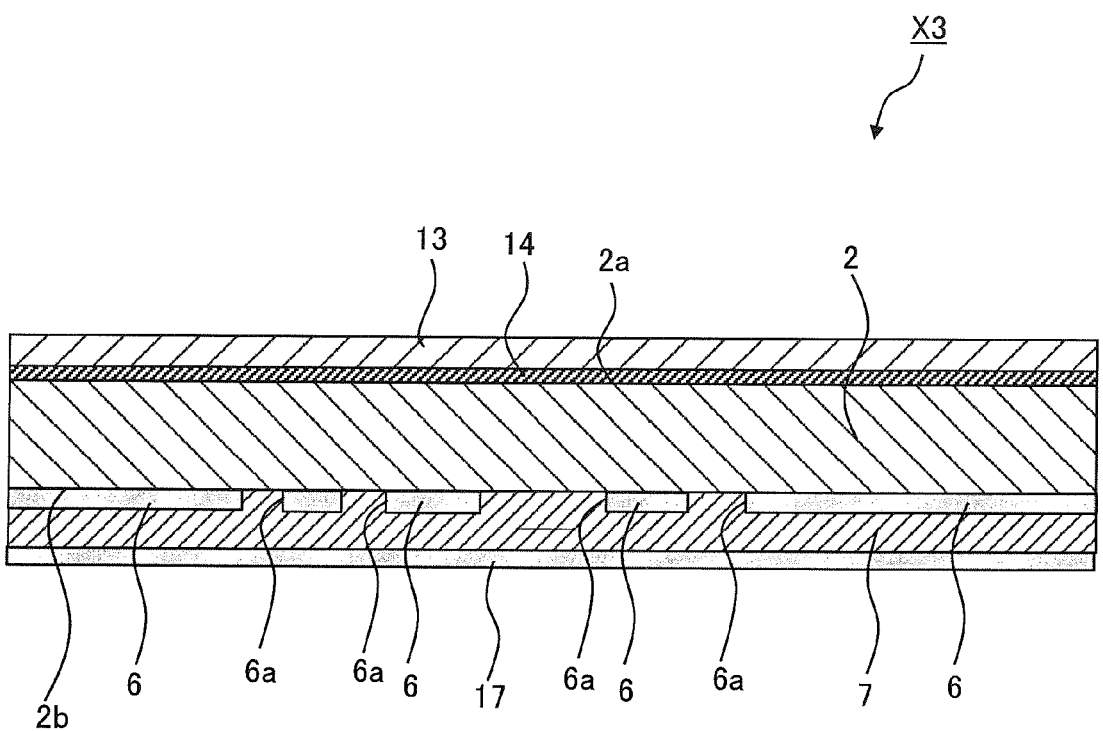
FIG. 16 is a sectional view taken along the line VII-VII of FIG. 15.
Figure 17:
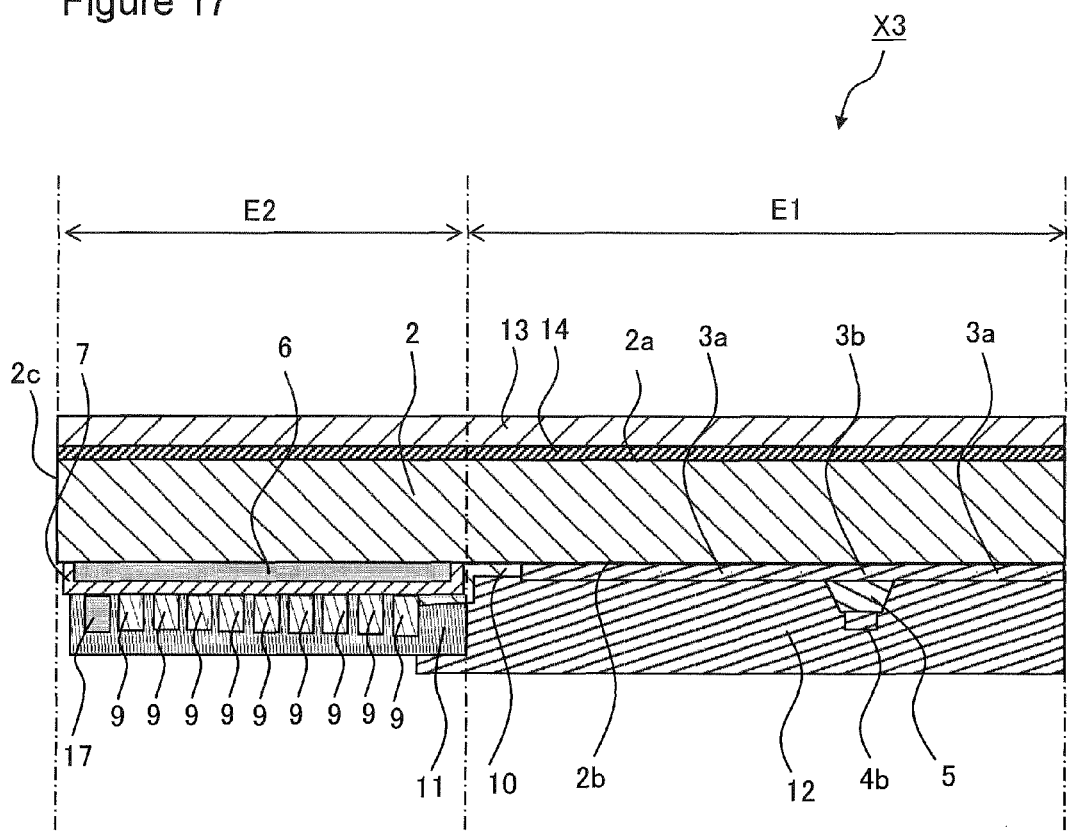
FIG. 17 is a sectional view taken along the line VIII-VIII of FIG. 15.

FIG. 14 is a plan view of a schematic configuration of an input device X3 according to Modification 2. FIG. 15 is a plan view of the schematic configuration of the input device X3 according to Modification 2 with the substrate 2 transparently shown. FIG. 16 is a sectional view taken along the line VII-VII of FIG. 15. FIG. 17 is a sectional view taken along the line VIII-VIII of FIG. 15. In FIGS. 14 to 17, the components having the same functions as those of FIGS. 1, 2, 5, and 6 are denoted by the same reference numerals, and detailed description thereof is omitted. Further, in FIG. 15, for convenience of explanation, the insulator 5, the second protective layer 11, the third protective layer 12, the protective sheet 13, and the adhesive layer 14 are not illustrated.

As shown in FIGS. 14 to 17, in the input device X3, a second decorative layer 17 is provided instead of the second decorative layer 8 of the input device X1. Further, the second decorative layer 17 has conductive property. A material of the second decorative layer 17 may include, for example, a metal thin film. The second decorative layer 17 is disposed on the side close to the end face 2c of the substrate 2 with respect to the first detection electrodes 3a and the second detection electrodes 4a. Specifically, the second decorative layer 17 is disposed on the first protective layer 7 along the periphery of the substrate 2 so as to surround the first detection electrodes 3a and the second detection electrodes 4a. As a consequence, for example, when the input device X3 incorporated in the display device, an electric noise generated from the display device, electronic elements located around the input device X3 or the like can be suppressed by the second decorative layer 17. Accordingly, a possibility that a detection sensitivity of the input device X3 decreases due to the electric noise affecting to the first detection electrodes 3a and the second detection electrodes 4a can be reduced.

In this specification, "surrounding the first detection electrodes 3a and the second detection electrodes 4a" means that the first detection electrodes 3a and the second detection electrodes 4a may not entirely surrounded by the second decorative layer 17, and for example, the first detection electrodes 3a and the second detection electrodes 4a may be surrounded by the second decorative layer 17 and the outside conduction area G1 as shown in FIG. 15.

In Modification 2, while the second decorative layer 17 is disposed so as to surround the first detection electrodes 3a and the second detection electrodes 4a, it is not limited thereto. The second decorative layer 17 may be disposed on the side close to the end face 2c of the substrate 2 with respect to the first detection electrodes 3a and the second detection electrodes 4a.

Further, in Modification 2, the second decorative layer 17 is disposed so as to surround the detection wirings 9. Accordingly, a possibility that a detection sensitivity of the input device X3 decreases due to the electric noise affecting to the detection wirings 9. Further, the second decorative layer 17 may be located inside the substrate 2 with respect to the detection wirings 9 in plan view.

The second decorative layer 17 is preferably set to the ground potential. The ground potential refers to a reference potential for driving the input device X3. When the second decorative layer 17 is set to the ground potential, the above described electric noise can be more effectively suppressed. Accordingly, a possibility that a detection sensitivity of the input device X3 decreases can be further reduced.

Modification 3

Figure 18:
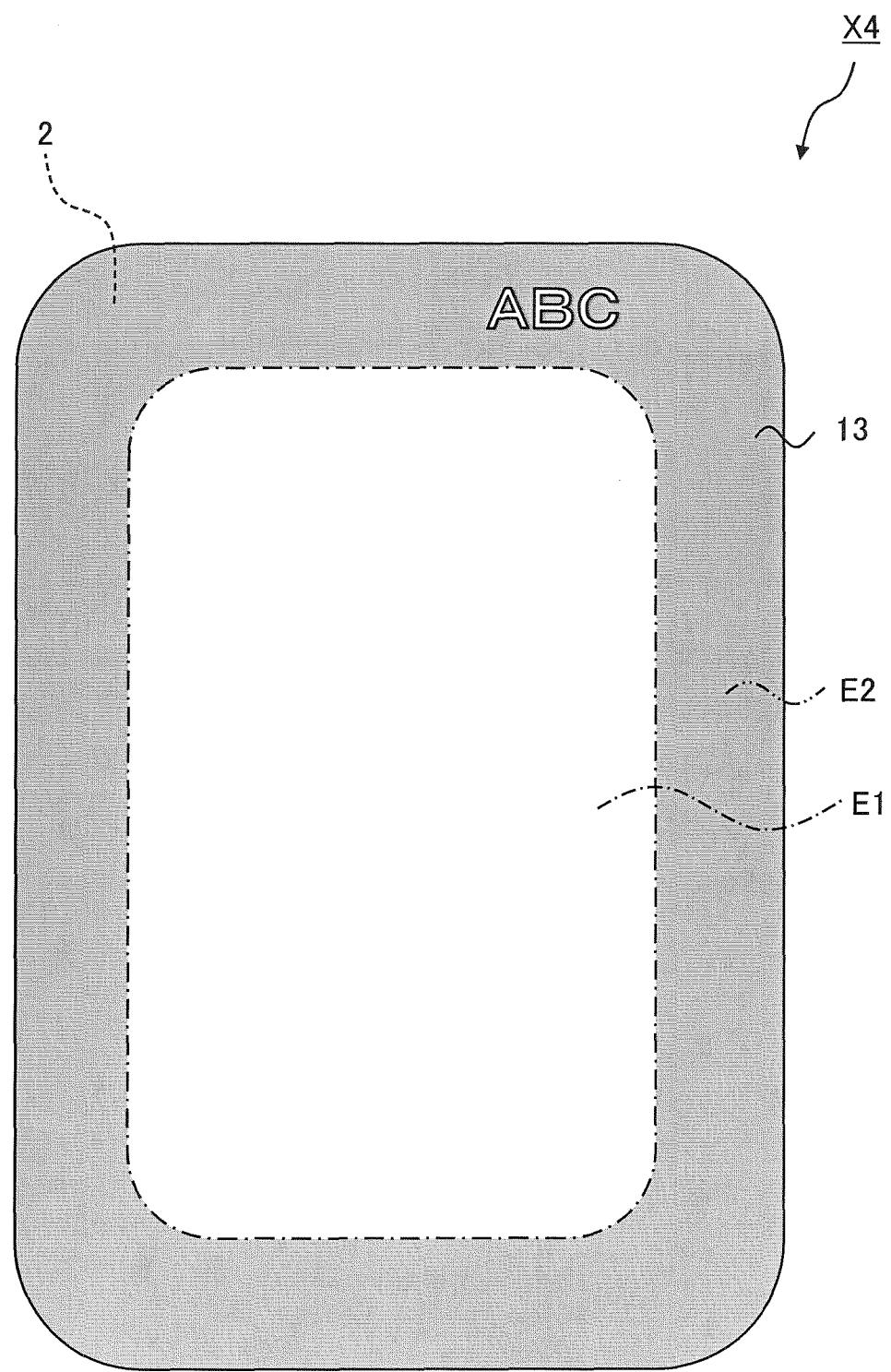
FIG. 18 is a plan view of a schematic configuration of an input device according to Modification 3.
Figure 19:
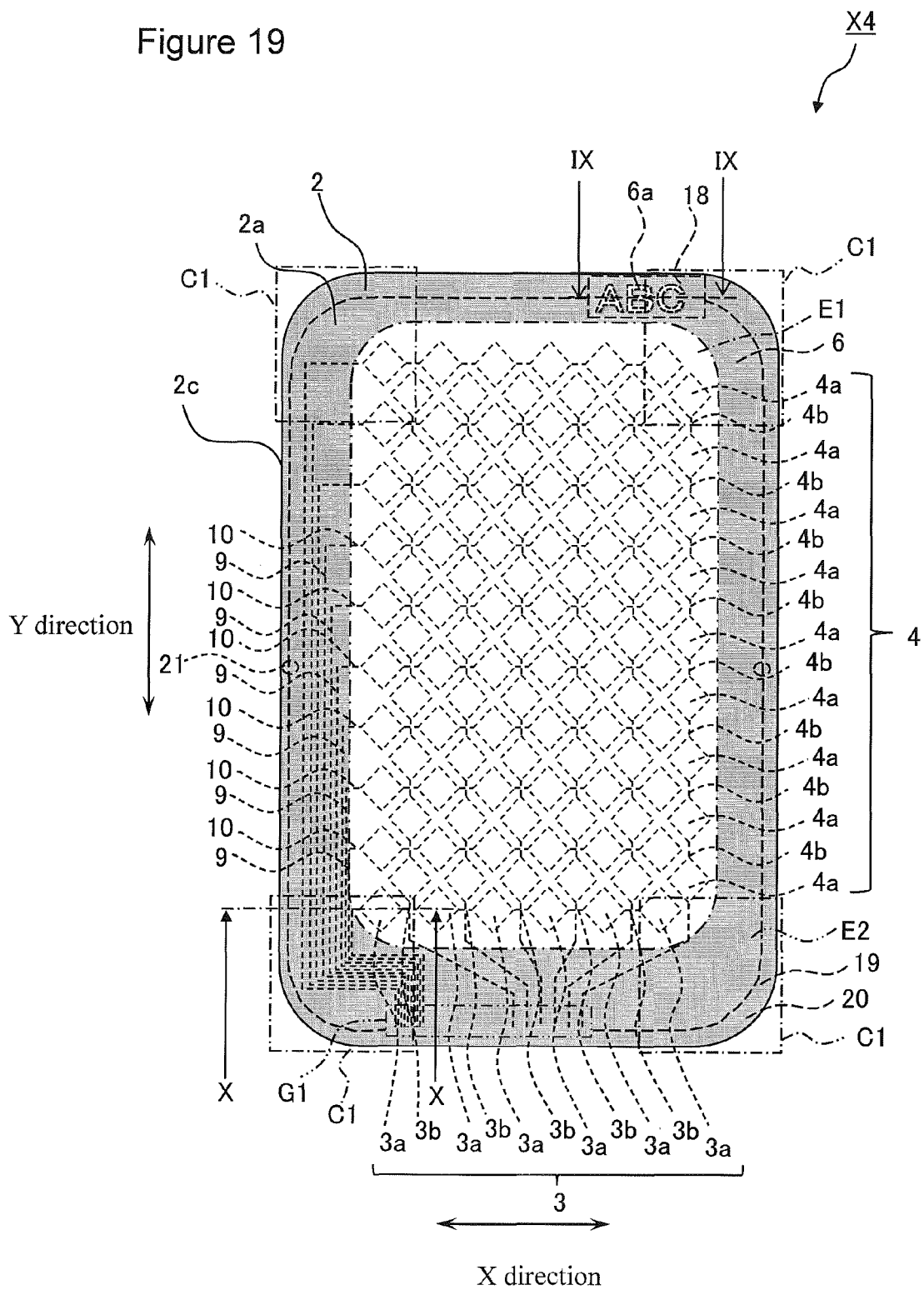
FIG. 19 is a plan view of the schematic configuration of the input device according to Modification 3 with the substrate transparently shown.
Figure 20:
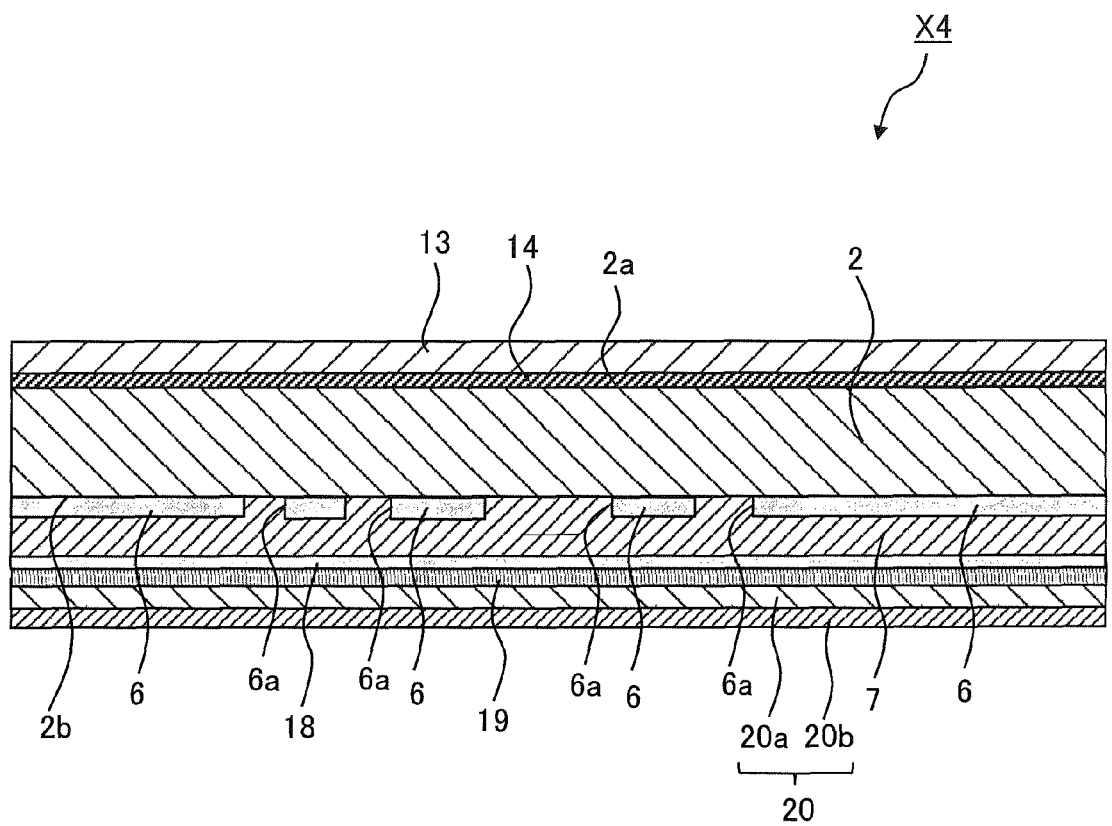
FIG. 20 is a sectional view taken along the line IX-IX of FIG. 19.
Figure 21:
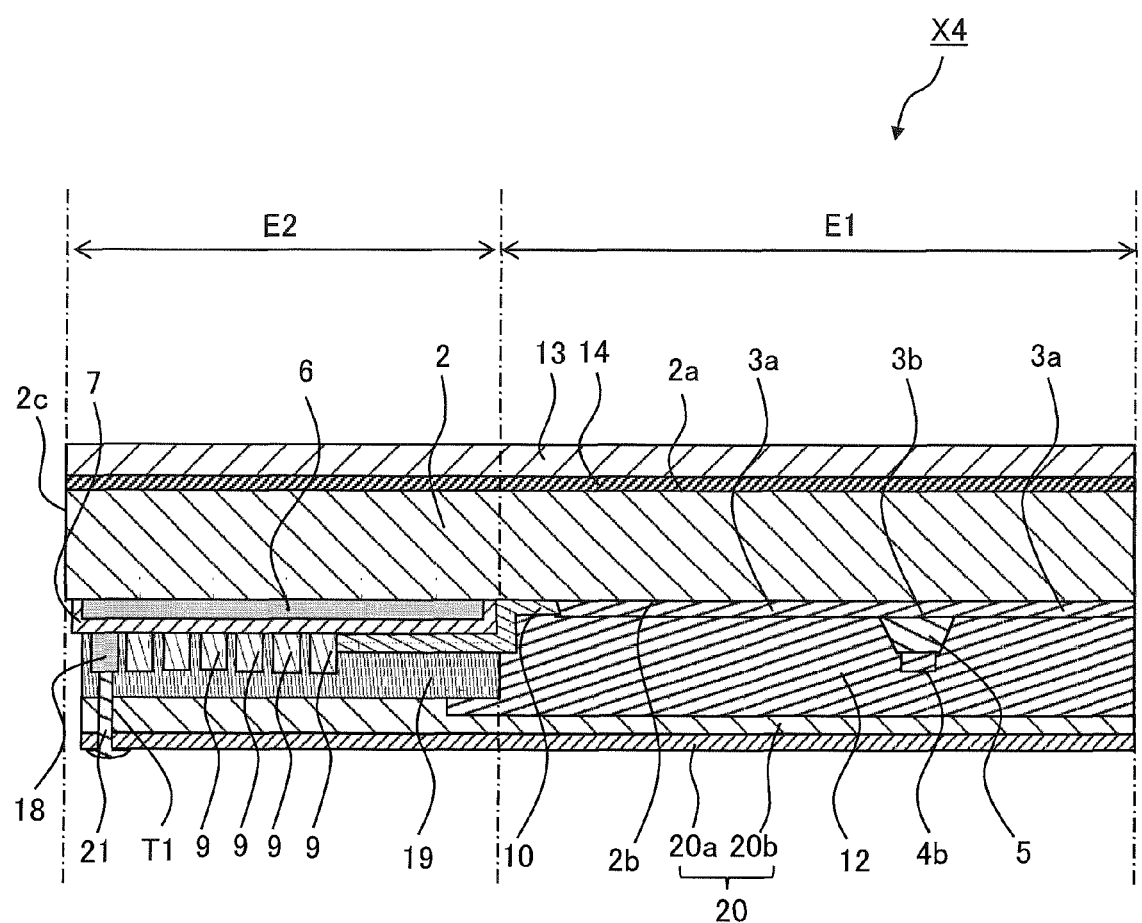
FIG. 21 is a sectional view taken along the line X-X of FIG. 19.

FIG. 18 is a plan view of a schematic configuration of an input device X4 according to Modification 3. FIG. 19 is a plan view of the schematic configuration of the input device X4 according to Modification 3 with the substrate 2 transparently shown. FIG. 20 is a sectional view taken along the line IX-IX of FIG. 19. FIG. 21 is a sectional view taken along the line X-X of FIG. 19. In FIGS. 18 to 21, the components having the same functions as those of FIGS. 1, 2, 5, and 6 are denoted by the same reference numerals, and detailed description thereof is omitted. Further, in FIG. 19, for convenience of explanation, the insulator 5, the first protective layer 7, the third protective layer 12, the protective sheet 13, and the adhesive layer 14 are not illustrated.

As shown in FIGS. 18 to 21, in the input device X4, a second decorative layer 18 is provided instead of the second decorative layer 8 of the input device X1. The second decorative layer 18 has conductive property. Further, the second decorative layer 18 is disposed on the first protective layer 7 along the periphery of the substrate 2 so as to surround the first detection electrodes 3a and the second detection electrodes 4a. A material of the second decorative layer 18 may include, for example, a metal thin film. In the input device X4, a second protective layer 19 is provided instead of the second protective layer 11 of the input device X1. The second protective layer 19 covers the detection wirings 9 and the second decorative layer 18 and is disposed on the entire area of the first protective layer 7.

The input device X4 further includes a shield layer 20 and a conduction section 21.

The shield layer 20 has a role of reducing an effect of noise to the first detection electrodes 3a and the second detection electrodes 4a. The shield layer 20 is disposed on the second main surface 2b of the substrate 2 which corresponds to the input area E1 so as to cover the first detection electrodes 3a and the second detection electrodes 4a in plan view. The shield layer 20 is disposed on the second protective layer 19 which corresponds to the non-input area E2 so as to cover the second decorative layer 18. The shield layer 20 includes a base film 20a and a conductive member 20b. The base film 20a has an insulative property, and the conductive member 20b is disposed on the base film 20a. The base film 20a may include, for example, a polyester film, a polypropylene film, and a polyethylene film. The conductive member 14b may include, for example, ITO, IZO, ATO, AZO, tin oxide, zinc oxide, and or conductive high molecule.

The conduction section 21 has a role of electrically connecting the second decorative layer 18 to the conductive member 20b in the shield layer 20. The conduction section 21 is formed, as shown in FIG. 20, by providing a through hole T1 in the second protective layer 11 and the base film 20a and forming a conductor made of a solder, silver paste or the like at the through hole T1. When the second decorative layer 18 and the conduction member 20b in the shield layer 20 are electrically connected by the conduction section 21, a resistance value of the conduction member 20b can be reduced. Accordingly, the noise to the first detection electrodes 3a and the second detection electrodes 4a can be more efficiently shielded. The conduction section 21 is provided on the substrate 2 in an area other than a corner C1. Accordingly, even if the substrate 2 is subject to thermal contraction, a possibility that a crack is formed in the conduction section 21 can be reduced.

In Modification 3, the corner C1 is an area closest to a corner of the substrate 2, in plan view, among the areas formed by lines perpendicular to the long side of the substrate 2 and lines perpendicular to the short side of the substrate 2, equally dividing the long side of the substrate 2 and the short side of the substrate 2 into eight, respectively. Further, in Modification 3, while the conduction sections 21 are provided in two areas, the conduction sections 21 may be provided in any number of areas as long as being outside the corner C1 of the substrate 2.

Modification 4

Figure 5:
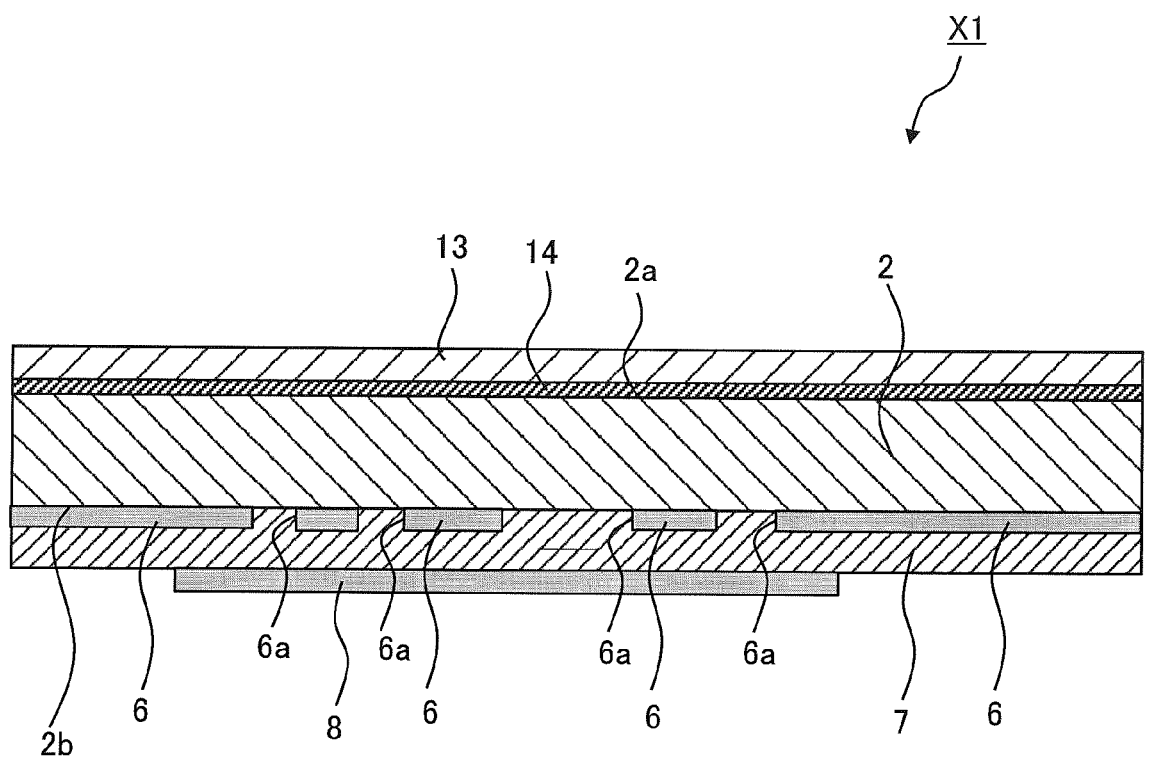
FIG. 5 is a sectional view taken along the line III-III of FIG. 2.
Figure 22:
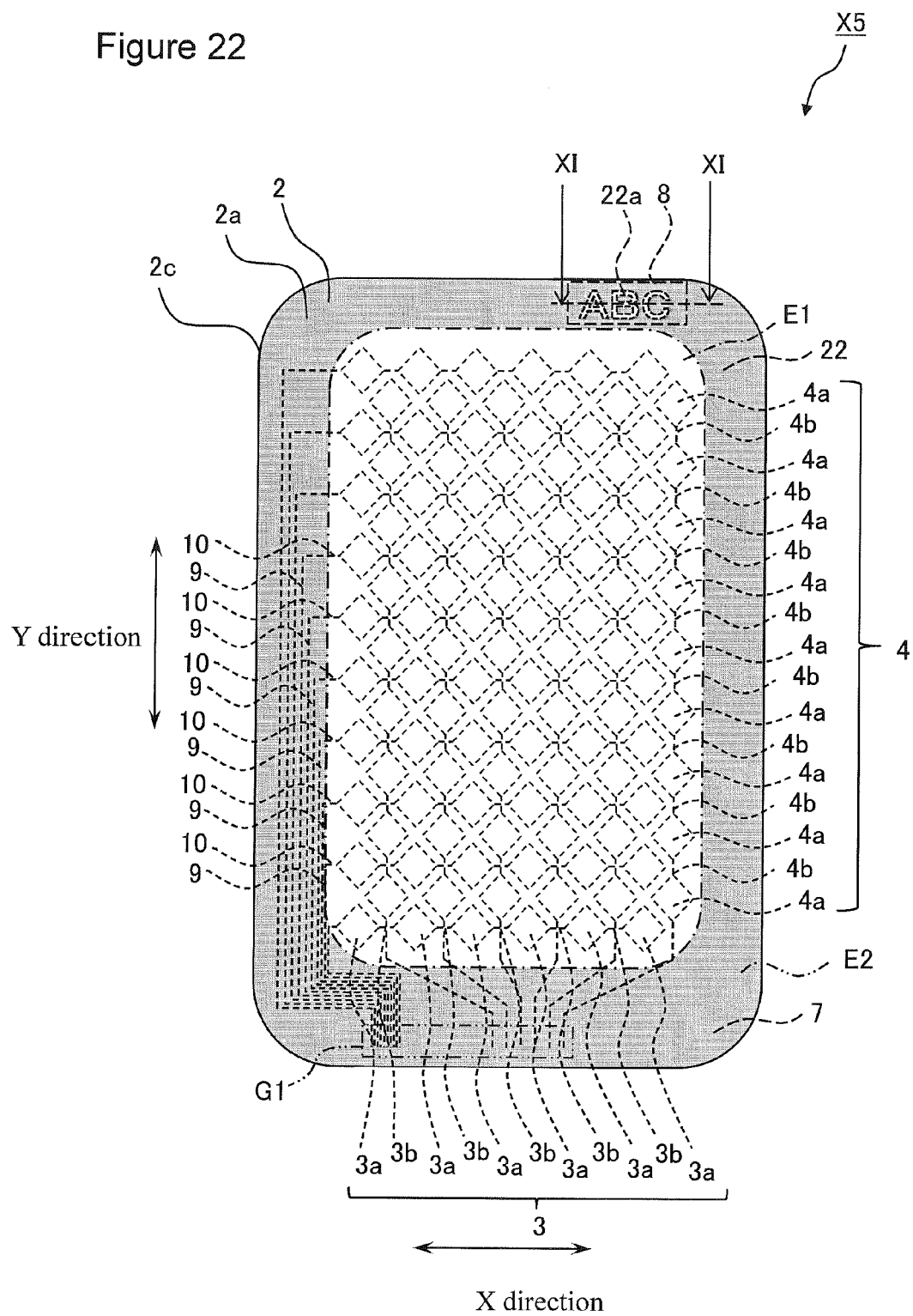
FIG. 22 is a plan view of the schematic configuration of the input device according to Modification 4 with the substrate transparently shown.
Figure 23:
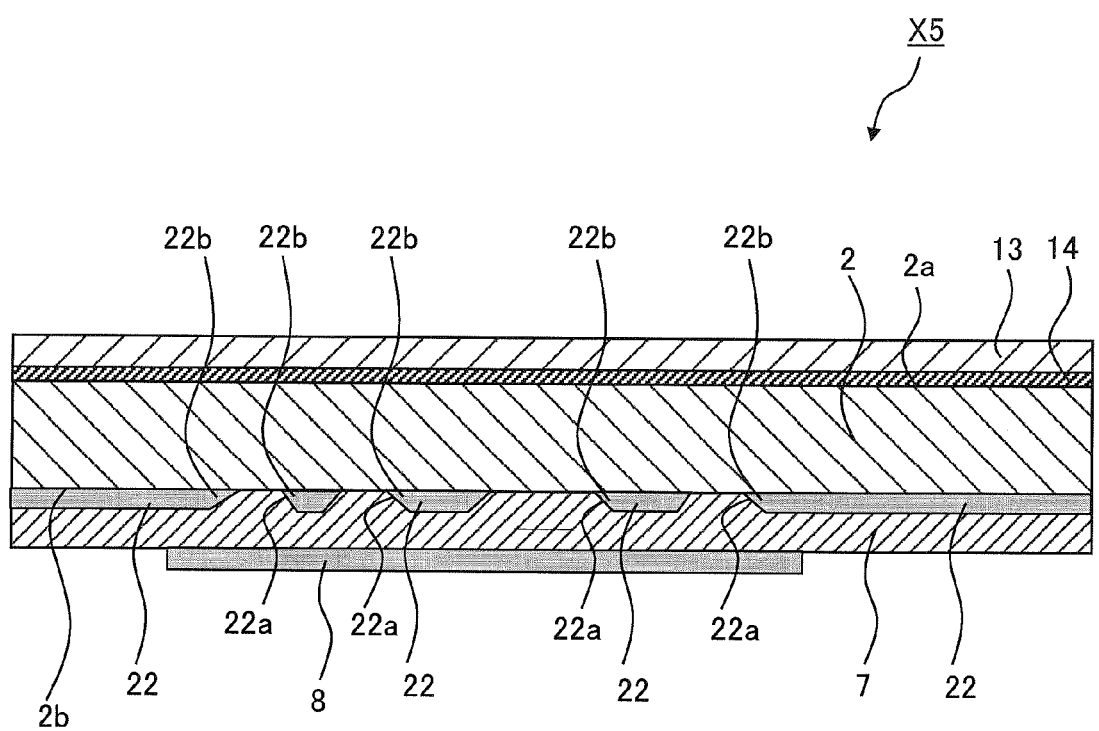
FIG. 23 is a sectional view taken along the line XI-XI of FIG. 22.

FIG. 22 is a plan view of the schematic configuration of the input device X5 according to Modification 3 with the substrate 2 transparently shown. FIG. 23 is a sectional view taken along the line XI-XI of FIG. 22. In FIGS. 22 and 23, the components having the same functions as those of FIGS. 2 and 5 are denoted by the same reference numerals, and detailed description thereof is omitted. Further, in FIG. 22, for convenience of explanation, the insulator 5, the first protective layer 7, the third protective layer 12, the protective sheet 13, and the adhesive layer 14 are not illustrated.

As shown in FIGS. 22 and 23, in the input device X5, a first decorative layer 22 is provided instead of the first decorative layer 6 of the input device X1.

The first decorative layer 22 is disposed on the second main surface 2b of the substrate 2 which corresponds to the non-input area E2. The first decorative layer 22 includes an opening 22a. The opening 22a is provided, for example, to indicate letters, figures or the like to the user. Accordingly, the opening 22a has a shape which shows specific letters, figures or the like in plan view. In this case, an edge 22b of the first decorative layer 22 that surrounds opening 22a in plan view has a thickness which decreases toward the opening 22a. Specifically, the edge 22b has an inclined surface. Accordingly, when the first protective layer 7 is disposed on the first decorative layer 22, a possibility that air bubbles enters between part of the first protective layer 7 which is located inside the opening 22a and the second main surface 2b of the substrate 2 can be reduced.

While the surface of the edge 22b in this embodiment is an inclined surface, it is not limited thereto and may be a convex surface or a concave surface.

Modification 5

The foregoing embodiment and Modifications 1 to 4 have been individually and specifically described herein. However, the invention is not limited thereto and also includes a combination of matters individually described in the above embodiment and Modifications 1 to 4 as appropriate. That is, the input device according to the present invention is not limited to the input devices X1 to X5 and also includes the input devices which include a combination of matters individually described in the above embodiment and Modifications 1 to 4 as appropriate.

Further, the display device Y1 which includes the input device X1 has been described in the above embodiment. However, it is not limited thereto and the input devices X2 to X5 may be employed in place of the input device X1.

Further, the mobile terminal Z1 which includes the input device X1 has been described in the above embodiment. However, it is not limited thereto and the input devices X2 to X5 may be employed in place of the input device X1.

REFERENCE SIGNS LIST

X1-X5 input device
Y1 display device
Z1 mobile terminal (electronic device)
C1 corner
2 substrate
2a first main surface of substrate
2b second main surface of substrate
2c end face of substrate
3a first detection electrode
4a second detection electrode
6, 22 first decorative layer
6a, 22a opening of first decorative layer
22c edge of first decorative layer
7 first protective layer
8, 16-18 second decorative layer
9 detection wirings
20 shield layer
21 conduction section
200 display panel
501 voice input unit
504 second housing (housing)

The invention claimed is:

1. An input device comprising:
a substrate;
a detection electrode which is disposed on the substrate;
a first decorative layer that is disposed on the substrate and includes an opening;
a first protective layer that is disposed on the first decorative layer and is partially located inside the opening;
a detection wiring which is disposed to contact the first protective layer and is electrically connected to the detection electrode; and
a second decorative layer disposed to contact the first protective layer,
wherein the second decorative layer is located so as to overlap with the opening in a plan view, and
wherein the second decorative layer and the detection wiring are made of a same material.

2. The input device according to claim 1,
wherein the second decorative layer and the detection wiring are disposed on a surface of the first protective layer.

3. The input device according to claim 1, wherein an edge of the first decorative layer which surrounds the opening has a thickness which decreases toward the opening.

4. The input device according to claim 1, wherein the first protective layer has a substantially flat surface.

5. A display device comprising:
the input device according claim 1; and
a display panel which is disposed to be opposed to the input device.

6. An electronic device comprising:
the display device according to claim 5; and
a housing which houses the display device.

7. A mobile terminal comprising:
the display device according to claim 5;
a voice input unit; and
a housing which houses the display device and the voice input unit.

8. The input device according to claim 1, wherein at least part of the second decorative layer is located on a side close to the end face of the substrate with respect to the detection wiring.

9. The input device according to claim 8, further comprising a shield layer which is disposed on the detection electrode, the detection wiring, and the second decorative layer,
wherein the shield layer is electrically connected to the second decorative layer via a conduction section.

10. The input device according to claim 9, wherein the substrate is in a substantially rectangular shape in a plan view, and
the conduction section is disposed in an area other than a corner of the substrate.

11. The input device according to claim 1, wherein the substrate includes a first main surface and a second main surface which is located opposite to the first main surface,
the first main surface of the substrate is located on a side on which an input operation is performed with respect to the second main surface, and the detection electrode, the first decorative layer, the first protective layer, the detection wiring, and the second decorative layer are disposed on the second main surface of the substrate.

12. The input device according to claim 11, wherein the substrate further includes an end face between the first main surface and the second main surface, and
the first decorative layer is located on a side close to the end face of the substrate with respect to the detection electrode.

13. The input device according to claim 12, wherein the first decorative layer is located so as to surround the detection electrode in a plan view.

14. The input device according to claim 12, wherein the detection wiring overlaps with the first decorative layer in an area other than the opening in a plan view.

15. The input device according to claim 14, further comprising a second protective layer which is disposed on the first protective layer and covers the detection wiring, wherein the second decorative layer is disposed on the second protective layer, and
at least a part of the detection wiring is located in an area in which the first decorative layer overlaps with the second decorative layer in a plan view.

16. The input device according to claim 15, wherein an area in which the first decorative layer is located is substantially identical to an area in which the second decorative layer is located in a plan view.

* * * * *